(12) United States Patent
Breinlinger et al.

(10) Patent No.: US 9,702,904 B2
(45) Date of Patent: Jul. 11, 2017

(54) NON-LINEAR VERTICAL LEAF SPRING

(75) Inventors: Keith J. Breinlinger, San Ramon, CA (US); Benjamin N. Eldridge, Danville, CA (US); Eric D. Hobbs, Livermore, CA (US); Michael J. Armstrong, Danville, CA (US); John K. Gritters, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 459 days.

(21) Appl. No.: 13/288,925

(22) Filed: Nov. 3, 2011

(65) Prior Publication Data
US 2012/0242363 A1   Sep. 27, 2012

Related U.S. Application Data

(60) Provisional application No. 61/454,910, filed on Mar. 21, 2011.

(51) Int. Cl.
*G01R 1/067* (2006.01)
*H01R 13/24* (2006.01)
(Continued)

(52) U.S. Cl.
CPC ..... *G01R 1/06716* (2013.01); *G01R 1/06733* (2013.01); *G01R 1/07357* (2013.01);
(Continued)

(58) Field of Classification Search
CPC ...... G01R 1/067; G01R 3/00; G01R 1/06733; G01R 1/06716; G01R 1/07357;
(Continued)

(56) References Cited

U.S. PATENT DOCUMENTS 4,027,935 A * 6/1977 Byrnes et al. ............... 439/289
4,618,821 A   10/1986 Lenz
(Continued)

FOREIGN PATENT DOCUMENTS

JP   09-017535   1/1997
JP   2004-156993   6/2004
(Continued)

OTHER PUBLICATIONS

WO 2012/128907 (int'l application No. PCT/US2012/027216), International Preliminary Report on Patentability (Sep. 24, 2013), 5 pages.
(Continued)

*Primary Examiner* — Son Le
*Assistant Examiner* — Brent J Andrews
(74) *Attorney, Agent, or Firm* — Lumen Patent Firm

(57) ABSTRACT

An electrically conductive contact element can include a first base and a second base with elongate, spaced apart leaves between the bases. A first end of each leaf can be coupled to the first base and an opposite second end of the leaf can be coupled to the second base. A body of the leaf between the first end and the second end can be sufficiently elongate to respond to a force through said contact element substantially parallel with the first axis and the second axis by first compressing axially while said force is less than a buckling force and then bending while said force is greater than the buckling force.

28 Claims, 20 Drawing Sheets

(51) Int. Cl.
*G01R 1/073* (2006.01)
*H01R 43/16* (2006.01)

(52) U.S. Cl.
CPC ......... *H01R 13/2407* (2013.01); *H01R 43/16* (2013.01); *Y10T 29/49204* (2015.01)

(58) Field of Classification Search
CPC .............. G01R 31/26; Y10T 29/49204; H01R 13/2407; H01R 43/16; H01R 24/66; H01R 24/00; H01R 13/02
USPC .................. 439/66, 884; 324/755.01–755.07
See application file for complete search history.

(56) References Cited

U.S. PATENT DOCUMENTS

| | | | |
|---|---|---|---|
| 5,286,208 | A | 2/1994 | Matsuoka |
| 6,252,415 | B1 | 6/2001 | Lefever et al. |
| 6,491,968 | B1 | 12/2002 | Mathieu et al. |
| 6,672,875 | B1 | 1/2004 | Mathieu et al. |
| 6,945,827 | B2 | 9/2005 | Grube et al. |
| 7,371,072 | B2 | 5/2008 | Mathieu et al. |
| 7,553,165 | B2 | 6/2009 | Mathieu et al. |
| 7,628,620 | B2 | 12/2009 | Gritters |
| 7,786,740 | B2 * | 8/2010 | Kister .................... 324/754.03 |
| 7,841,863 | B2 | 11/2010 | Mathieu et al. |
| 7,850,460 | B2 | 12/2010 | Weiland et al. |
| 7,851,794 | B2 | 12/2010 | Hobbs |
| 2001/0012739 | A1 | 8/2001 | Grube et al. |
| 2004/0121627 | A1 * | 6/2004 | Grube ................ G01R 1/06733 439/66 |
| 2005/0179458 | A1 | 8/2005 | Chen et al. |
| 2007/0247175 | A1 * | 10/2007 | Khandros et al. ............ 324/754 |
| 2007/0269997 | A1 * | 11/2007 | Eldridge et al. ................. 439/66 |
| 2008/0088327 | A1 * | 4/2008 | Kister ........................... 324/754 |
| 2008/0100312 | A1 * | 5/2008 | Breinlinger ................... 324/754 |
| 2009/0045831 | A1 | 2/2009 | Kimoto |
| 2009/0079455 | A1 * | 3/2009 | Gritters ......................... 324/762 |
| 2009/0197484 | A1 * | 8/2009 | Chen ..................... B82Y 10/00 439/884 |
| 2009/0263986 | A1 * | 10/2009 | Mathieu et al. ................. 439/66 |
| 2010/0134131 | A1 * | 6/2010 | Chen et al. .................... 324/761 |

FOREIGN PATENT DOCUMENTS

| | | |
|---|---|---|
| JP | 2008-032400 | 2/2008 |
| KR | 10-2001-0030367 | 4/2001 |

OTHER PUBLICATIONS

U.S. Appl. No. 13/250,756, filed Sep. 30, 2011, Fan et al.
WO 2012/128907, International Search Report, Sep. 27, 2012 (republished with International Search Report Nov. 8, 2012).

\* cited by examiner

Figure 1
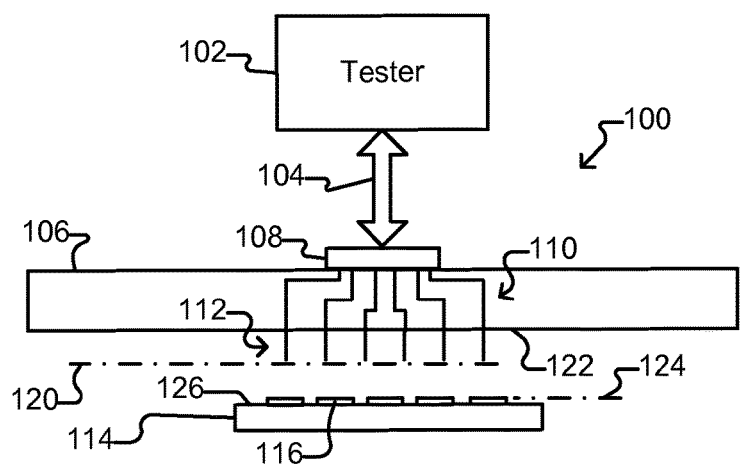
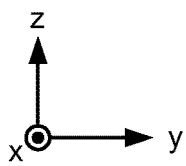

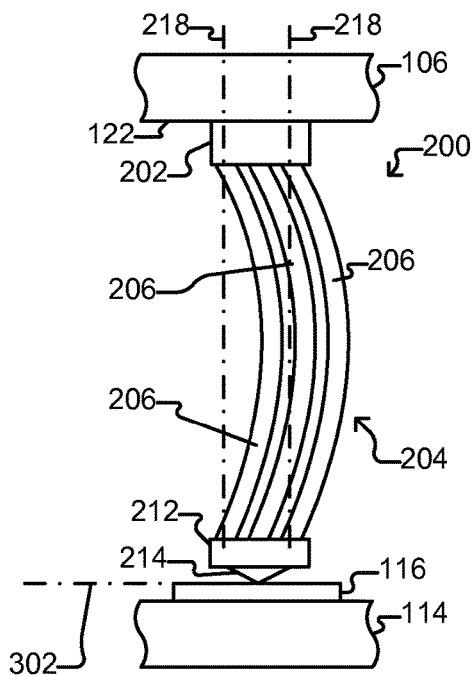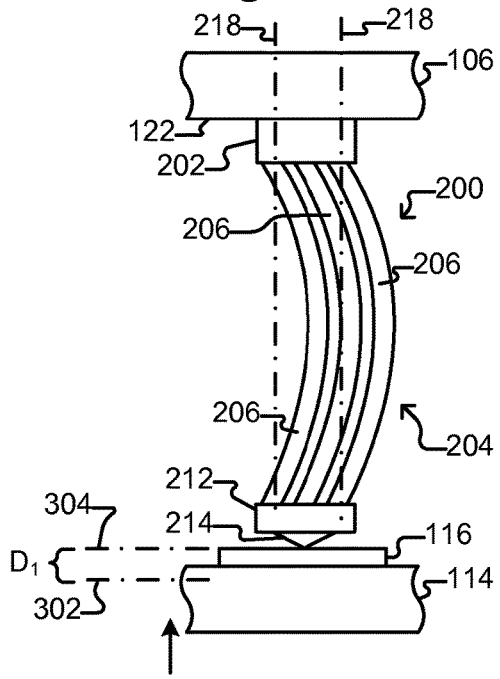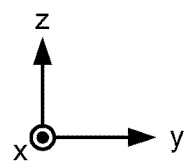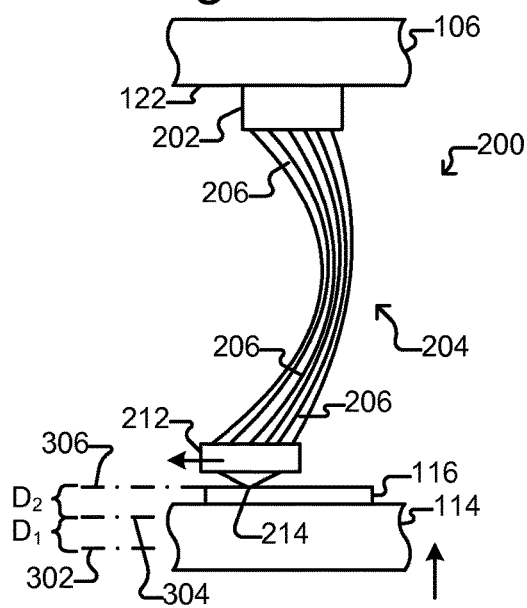

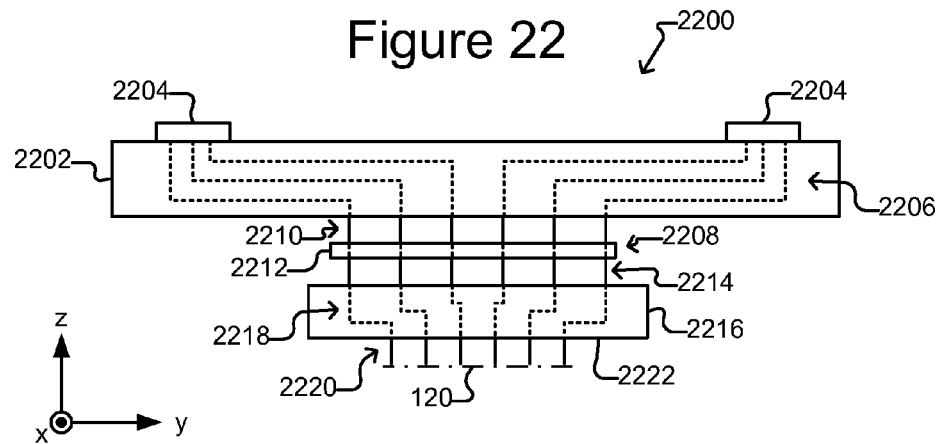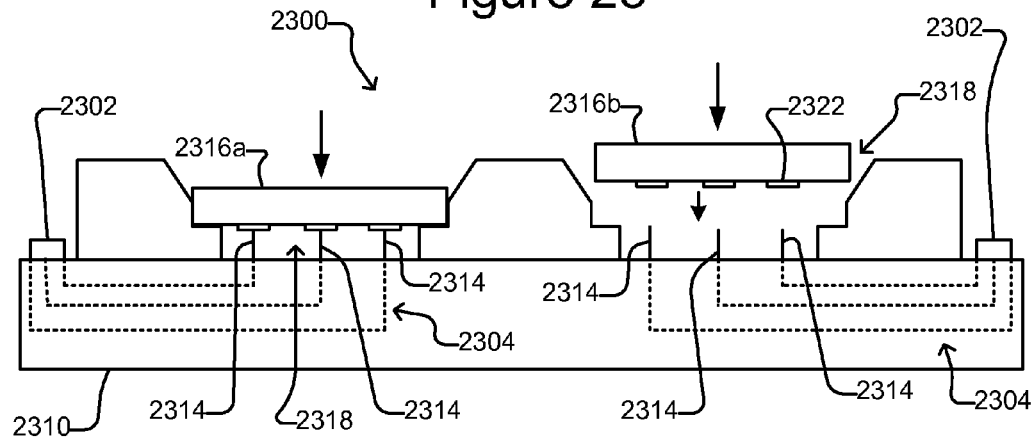

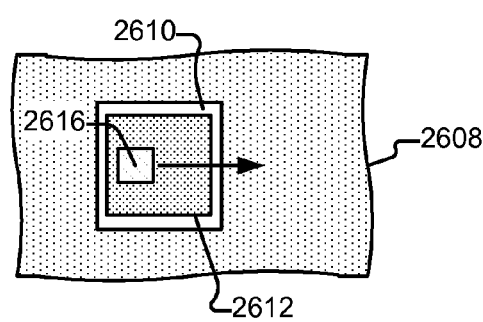
Figure 26B
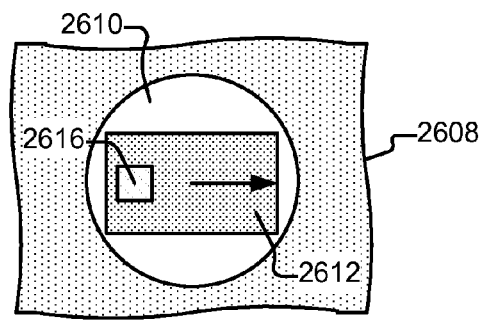
Figure 26C
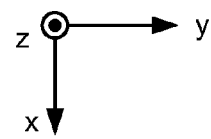
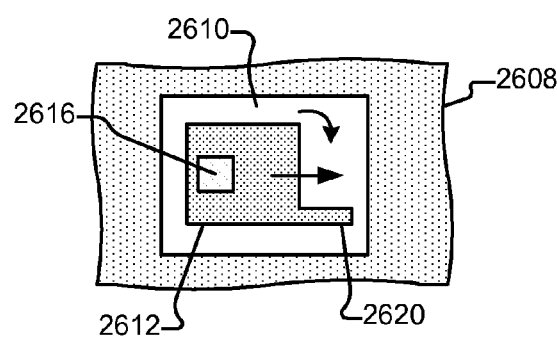
Figure 26D
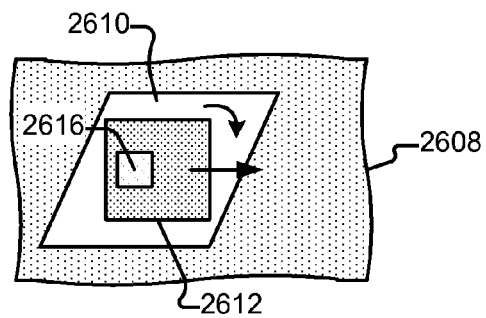
Figure 26E

NON-LINEAR VERTICAL LEAF SPRING

CROSS REFERENCE TO RELATED APPLICATION(S)

This application is a non-provisional (and thus claims the benefit of the filing date) of U.S. provisional patent application Ser. No. 61/454,910 (filed Mar. 21, 2011), which is incorporated herein by reference in its entirety.

BACKGROUND

Electrically conductive contact elements (e.g., probes) can make electrical connections between electrical devices. For example, such contact elements can be disposed between electrical devices to make electrical connections between the devices. As another example, such contact elements can be part of one electronic device, and the contact elements can be moved into contact with terminals of another electronic device to form pressure-based electrical connections with the other device. Testing of newly manufactured electronic devices (e.g., semiconductor dies) is one example of an application for the foregoing. Regardless of the application, however, vertical contact elements can be advantageous as can contact elements that exhibit a non-linear spring response to forces through the contact element.

SUMMARY

In some embodiments, an electrically conductive contact element can include a first base and a second base that can be spaced apart from the first base. The contact element can further include a first leaf and a second leaf. A first end of the first leaf can be disposed on a first axis and directly coupled to the first base, and a second end of the first leaf can be disposed on the first axis and directly coupled to the second base. A first end of the second leaf can be similarly disposed on a second axis and directly coupled to the first base, and a second end of the second leaf can be disposed on the second axis and directly coupled to the second base. The first leaf and the second leaf can be sufficiently elongate to respond to a force through the contact element that is substantially parallel with the first axis and the second axis by compressing axially while the force is less than a buckling force and bending while the force is greater than the buckling force.

In some embodiments, a contactor can include a substrate, which can have a surface and holes into the surface. The contactor can also include electrically conductive contact elements each of which can be disposed in one of the holes. Each of the contact elements can include spaced apart substantially parallel leaves connected by tie bars, and each leaf can further include a first contact extending from the surface of the substrate.

In some embodiments, a process of making a contact element can include fabricating a first base and a second base with elongate, spaced apart leaves between the first base and the second base. A first end of a first leaf can be disposed on a first axis and directly coupled to the first base, and a second end of the first leaf can be disposed on the first axis and directly coupled to the second base. A first end of a second leaf can similarly be disposed on a second axis and directly coupled to the first base, and a second end of the second leaf can be disposed on the second axis and directly coupled to the second base. The first axis and the second axis can be substantially parallel to a third axis that passes through the first base and the second base.

BRIEF DESCRIPTION OF THE DRAWINGS

FIG. 1 illustrates an example of a test system according to some embodiments of the invention.

FIGS. 3A and 3B illustrate compression of the vertical contact element of FIGS. 2A and 2B according to some embodiments of the invention.

FIG. 3C illustrates buckling of the vertical contact element of FIGS. 2A and 2B according to some embodiments of the invention.

FIG. 20B illustrates an example of the resulting contact element according to some embodiments of the invention.

FIGS. 21B and 21C illustrate examples of a resulting contact element according to some embodiments of the invention.

FIG. 22 illustrates an example of a probe card assembly, which can be an example of the contactor of FIG. 1 according to some embodiments of the invention.

FIG. 23 illustrates an example of a test socket, which can be an example of the contactor of FIG. 1 according to some embodiments of the invention.

FIGS. 26B-26E illustrate examples of the holes in a guide plate in FIG. 26A according to some embodiments of the invention.

DETAILED DESCRIPTION OF EXEMPLARY EMBODIMENTS

Figure 2A:
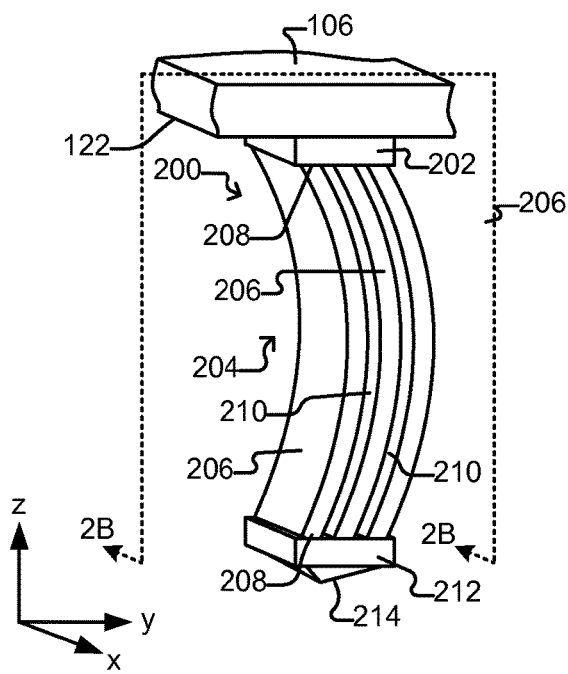
FIGS. 2A and 2B illustrate an example of a vertical contact element comprising a body with spaced leaves according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Examples of a non-linear electric contact element are disclosed herein. Such a contact element can be electrically conductive, and can be used to make pressure-based electrical connections between two electronic apparatuses or devices. Alternatively, the non-linear contact element can be coupled (e.g., by soldering, press-fitting, or the like) to one electronic apparatus or device and make a pressure-based electrical connection with another electronic apparatus or device. The contact element can be generally vertical and can comprise leaves between ends of the contact element. The leaves can be configured such that the contact element has non-linear spring characteristics. For example, the leaves can be configured to buckle in response to a force from an end through the contact element. The contact element can have a first spring response characteristic prior to buckling and a second spring response characteristic after buckling.

There are several applications for such a contact element. For example, such contact elements can be used to interconnect two electronic elements in an electronics system. For example, such contact elements can interconnect terminals, pads, bumps, or the like on two semiconductor dies, two printed circuit boards, a die and a printed circuit board, or the like. Another example of an application for such contact elements is testing. FIG. 1 illustrates an example of a test system in which vertical, non-linear contact, electrically conductive elements 112 can make pressure-based electrical connections with terminals 116 of a DUT 114.

FIG. 1 illustrates a test system 100 for testing DUT 114 in which vertical, non-linear contact elements 112 can make pressure-based electrical connections with terminals 116 of DUT 114. The acronym DUT is short for "device under test," and DUT 114 in FIG. 1 can be one or more electronic devices. Indeed, DUT 114 can be any type of electronic device or devices to be tested through contact with contact elements 112. Examples of DUT 114 include without limitation semiconductor dies (singulated or in wafer form, packaged or unpackaged), multi-die modules or other types of electronic modules, printed circuit boards, or the like. Terminals 116 can be any feature (e.g., pads, test features, bumps, solder balls, or the like) by which power, ground, signals (e.g., control, status, data, address, and the like), and the like can be provided to and obtained from DUT 114.

As shown in FIG. 1, test system 100 can include a tester 102 configured to control testing of DUT 114 and a contactor 106 configured to be an interface between tester 102 and DUT 114. Communications channels 104 can interconnect tester 102 and contactor 106. In some embodiments, DUT 114 can be disposed on a stage (not shown) configured to hold and move DUT 114.

Tester 102 can comprise electronic control equipment such as one or more computers or computer systems. Tester 102 can control testing of DUT 114 by generating test signals (e.g., power and ground and signals such as control signals, data signals, and the like to be input into DUT 114) that are provided through communications channels 104 and contactor 106 to terminals 116 of DUT 114. The tester 102 can receive and/or evaluate response signals generated by DUT 114 in response to the test signals. The response signals can be sensed at terminals 116 of DUT 114 and provided to the tester 102 through contactor 106 and communications channels 104. Alternatively or in addition, some or all of the functions of the tester 102 can be disposed on contactor 106. For example, some or all of the tester 102 can be disposed on contactor 106.

Communications channels 104 can be any mechanism by which power and ground, test signals, response signals, and the like can be provided from and to tester 102. For example, channels 104 can be wires, cables, fiber optics lines, or the like. As other examples, channels 104 can be wireless communications channels.

Contactor 106 can be as simple as a substrate (e.g., a support substrate) or can comprise multiple components (any of which can be an example of a support substrate). Regardless, contactor 106 can include electrical interface 108, which can make electrical connections with channels 104, and contactor 106 can also include electrically conductive contact elements 112 for contacting terminals 116 of DUT 114. In some embodiments, spacing between adjacent terminals 116 can be as small as two-hundred microns, one-hundred microns, ninety microns, eighty microns, fifty microns, or less, although the spacing between adjacent terminals 116 in other embodiments can be greater than two-hundred microns. As will be seen, in some embodiments, contact elements 112 can be vertical contact elements comprising spaced apart leaves. Such vertical contact elements 112 can facilitate contacting terminals 116 that are spaced as closely as indicated above. Regardless, contact elements 112 can extend from a surface 122 of contactor 106 or a component of contactor 106. For example, contactor 106 can comprise multiple components (not shown), and contact elements 112 can extend from a surface 122 of one or more of those components. Contactor 106 or a component of contactor 106 can be an example of a support structure that supports contact elements 112.

Contactor 106 can also include electrical interconnections 110 between electrical interface 108 (and thus channels 104 when channels 104 are connected to interface 108) and contact elements 112 (and thus terminals 116 of DUT 114 when contact elements 112 are in contact with terminals 116). Electrical interface 108 can comprise any connector suitable for making electrical connections with channels 104. For example, electrical interface 108 can comprise zero-insertion-force electrical connectors, pogo-pin pads, or the like. As other examples, electrical interface can comprise fiber optic connectors, wireless transceivers, or the like. In practice, contactor 106 can be any of many different types of devices for providing an interface to DUT 114. For example, contactor 106 can be a probe card assembly (e.g., as illustrated in FIG. 22 and discussed below), a test socket (e.g., as illustrated in FIG. 23 and discussed below), a load board, or the like.

As illustrated in FIG. 1, contact portions (e.g., contact tips) of contact elements 112 configured to contact directly terminals 116 of DUT 114 can be or can be adjusted to be substantially in a contact plane 120, which can correspond substantially to a plane 124 of terminals 116 of DUT 114. With contact portions of contact elements 112 substantially in contact plane 120 that corresponds substantially a plane 124 of terminals 116 of DUT 114, contact elements 112 can contact and thereby make electrical connections with terminals 116. In addition to the plane 124 of terminals 116, contact plane 120 can correspond substantially to a surface 122 of contactor 106 or a component of contactor 106 from which contact elements 112 extend and/or a surface 126 of DUT on which terminals 116 are disposed. Thus, contact plane 120 can be substantially parallel to contactor surface 122 or DUT surface 126.

Figure 2B:
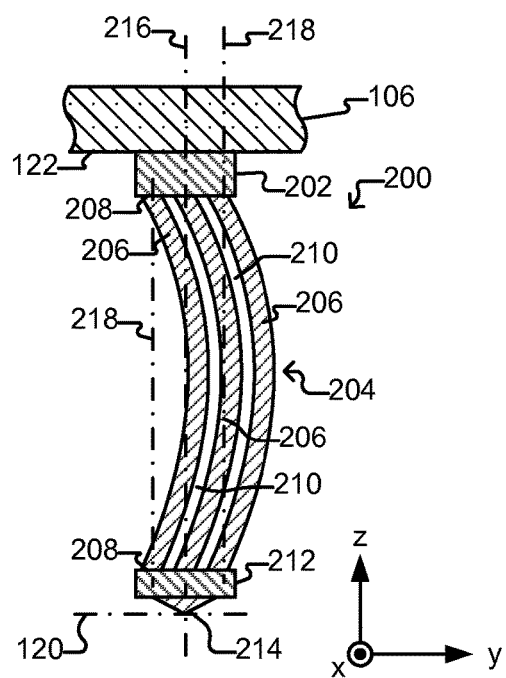

As mentioned, each contact element 112 can be a vertical contact element comprising a body of leaves. FIGS. 2A and 2B illustrate an example of a vertical contact element 200, which can be an example of a contact element 112 in FIG. 1. That is, each of contact elements 112 can be replaced in FIG. 1 by contact element 200.

As illustrated in FIGS. 2A and 2B, contact element 200 can comprise a first base end 202, a body 204, and a second base end 212. First base end 202 can be coupled to or otherwise held in contact with or proximity to a surface 122 of contactor 106 or a component of contactor 106. For example, first base end 202 can be coupled to or held in contact with or proximity to an electrically conductive terminal (not shown) on surface 122 of contactor 106. Such a terminal (not shown) can be electrically connected to one or more of interconnections 110 (see FIG. 1). Second base end 212 can comprise a contact tip 214 configured to make direct contact with a terminal 116 of DUT 114. As shown, body 204 can comprise multiple, elongate leaves 206. Each leaf 206 can deform elastically, plastically, or a combination of elastically and plastically. Opposite ends 208 of each leaf 206 can be coupled respectively to first base end 202 and second base end 212, and there can be a space 210 between each leaf 206. The first base 202, leaves 206, second base 212, and contact tip 214 can be electrically conductive.

That body 204 comprises spaced apart, elongate leaves 206 can provide advantages in some embodiments of the invention. For example, the spaced apart leaves 206 can reduce mechanical stress and increase deflection in response to a force on contact tip 214 (e.g., due to contact with a terminal 116 of DUT 114). This can allow the length of body 204 from first base end 202 to second base end 212 to be reduced. This can also allow contact element 200 to have a greater overall effective cross-sectional area and thus an increased current carrying capacity.

As mentioned above, contact element 200 can be a vertical contact element. A vertical contact element can be defined as a contact element whose first base end 202 and second base end 212 are on an axis 216 that is substantially perpendicular to contact plane 120. Substantially perpendicular can mean, for example, within plus or minus twenty, fifteen, ten, or five degrees of perpendicular. Alternatively, substantially perpendicular can mean within four, three, two, or one degree of perpendicular. Because as noted above, contact plane 120 can be substantially parallel with contactor surface 122 and/or the plane 124 of terminals 116 of DUT 116, axis 216 can alternatively be substantially perpendicular to contactor surface 122 and/or the plane 124 of terminals 116 of DUT 116. Contact tip 214 can be on axis 216 as shown or off of the axis 216.

In some embodiments, the leaves 206 of body 204 can be offset. For example, as illustrated in FIGS. 2A and 2B, the majority of the volume or mass of each leaf 206 can be displaced from an axis 218 that passes through each end 208 of the leaf 206. As another example, the centroid of each leaf 206 can be displaced from axis 218. As shown in FIGS. 2A and 2B, axis 218 can be parallel with axis 216. A leaf 206 can thus be "offset" if the majority of the volume or mass of the leaf 206 or the centroid of the leaf 206 is displaced from an axis 218 that passes through opposite ends 208 of the leaf 206. As illustrated in FIGS. 2A and 2B, in some embodiments, all of the leaves 206 of the body 204 of a contact element 200 can be offset in the same direction. In the example shown in FIGS. 2A and 2B, each leaf 206 is offset along the "y" axis. Of course, each leaf 206 could alternatively be, for example, offset along the "x" axis or along a combination of the "x" and "y" axes.

That the leaves 206 of a body 204 of a contact element 200 are elongate and disposed on an axis 218 as discussed above can provide advantages in some embodiments of the invention. For example, body 204—and thus contact element 200—can undergo controlled compression and then buckling in response to a force through body 204 that is substantially perpendicular with axes 218. For example, such a force can comprise a force applied to contact tip 214 (e.g., due to contact with a terminal 116 of DUT 114). FIGS. 3A-3C illustrate an example.

FIG. 3A shows a contact element 200 as a terminal 116 of DUT 114 makes first contact with the contact tip 214 of the contact element 200. The position of contact tip 214 and terminal 116 at first contact is labeled 302 in FIGS. 3A-3C. FIG. 3B shows contact element 200 after terminal 116 has moved from first contact 302 with contact tip 214 to position 304, which is labeled distance $D_1$ in FIG. 3B. As terminal 116 moves contact tip 214 from first contact at 302 over distance $D_1$ to position 304, the body 204 of contact element 200 compresses axially. For example, each of the leaves 206 of the body 204 can compress substantially along its axis 218, which as discussed above, passes through the ends 208 of the leaf 206. Moreover, because leaves 206 are offset as discussed above, the second base end 212 and thus tip 214 can have a tendency to move laterally (in the "x,y" plane) across terminal 116 as generally shown in FIG. 3C and/or rotate assuming friction or other forces do not prevent such lateral movement or rotation.

Figure 4:
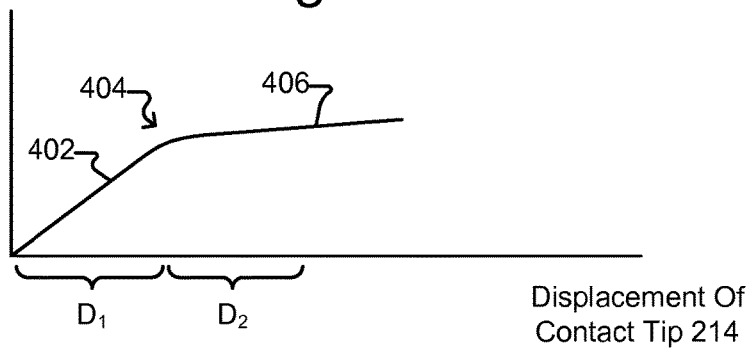
FIG. 4 illustrates an example of a bifurcated response of the vertical contact element of FIGS. 2A and 2B to a loading force according to some embodiments of the invention.

FIG. 4 shows an example of a force-to-displacement graph of the response of contact element 200 to an increasing force on contact tip 214. As shown by line 402, the force on the contact tip 214 and thus contact element 200 can increase in accordance with a function 402 as contact tip 214 is displaced from first contact at 302 with terminal 116 to position 304, which is illustrated in FIG. 4 as a generally linear function in accordance with Hooke's law. Function 402, however, need not be linear or in accordance with Hooke's law.

Referring to FIG. 3C, as terminal 116 moves past position 304 toward first base end 202 (e.g., along the "z" axis), body 204 can bend or buckle—as opposed to compressing axially—as shown in FIG. 3C. As shown in FIG. 4 by line 406, after body 204 bends or buckles at buckling point 404 (which can be an actual point between two linear functions 402 and 406 or a curve that can be approximated as a point as shown in FIG. 4), the force on contact tip 214 and thus contact element 200 can increase in accordance with a different function represented by line 406 (which can be non-linear in some embodiments). For example, further displacement of contact tip 214 by further movement of terminal 116 can result in only small increases or decreases in the force on contact tip 214 and thus contact element 200. Thus, as generally illustrated in FIG. 4, the actual or effective slope of the force-to-displacement function 402 can be two, three, four, five, or more times greater than the actual or effective slope of the force-to-displacement function 406. The force on contact tip 214 can thus increase at two, three, four, five, or more times the rate per unit of displacement of contact tip 214 (e.g., along the "z" axis") before the buckling point 404 at which the body 204 of a contact element 200 buckles than after the buckling point 404 at which the body 204 buckles. In some embodiments, the foregoing can provide an advantage of quickly achieving a contact force sufficient to make a low resistant contact and/or limiting the force on contact tip 214 and consequently the force on a terminal 116 of contact 114 that is pressed against the contact tip 214.

In short, each leaf 206 of contact element 200—and thus body 204—can be sufficiently elongate to, in response to a force through said body 204 (which can arise from a force on contact tip 204) that is substantially parallel to axes 218, compress axially in accordance with a first force-to-displacement function 402 prior to buckling point 404. At the buckling point 404, one or more of the leaves 206 of contact element 200—and thus body 204—can bend or buckle and thereafter respond to the aforementioned force in accordance with a second force-to-displacement function 406 after the buckling point 404. As noted below, function 406 need not be linear but, in fact, can be tailored to the needs of a particular application.

The graph illustrated in FIG. 4 is an example only. For example, functions 402 and 406 can have different slopes, and buckling point 404 can be located at a different location. As another example, buckling point 404 need not be a single point but can be multiple points or a region. In some embodiments, such multiple points or region can be created by configuring one or more of the leaves 206 to buckle at different buckling points on the graph illustrated in FIG. 4. As yet another example, one or both of functions 402 and 406 need not be lines (and thus need not be linear functions) but can be functions represented by simple or complex curves. Regardless, contact element 200 (and any variation of contact element 200 disclosed herein) can be non-linear in the sense that contact element 200 responds to a force through body 204 (e.g., a force arising from a force on contact tip 214) in accordance with a first function 402 prior to buckling at buckling point 404 and in accordance with a second function 406 after buckling.

The embodiment of contact element 200 illustrated in FIGS. 2A and 2B is an example, and variations are of course possible. For example, first base end 202, second base end 212, and/or contact tip 214 can have different shapes than shown in the figures herein. As another example, although three leaves 206 are shown, there can fewer or more leaves 206. For example, there can be four, five, ten, twenty, fifty, one hundred, or more leaves 206, or any number in between the foregoing number of leaves 206. As yet another example, one or more (including all) of leaves 206 need not be offset from an axis 218 passing through opposite ends 208 of the leaf 206. As a still further example, all leaves 206 need not be offset in a same direction. FIGS. 5-10 illustrate additional examples of variations of contact element 200, and any of the contact elements 500, 600, 700, 800, 900, and 1000 illustrated in FIGS. 5-10 can replace each of the contact elements 112 in FIG. 1.

Figure 5:
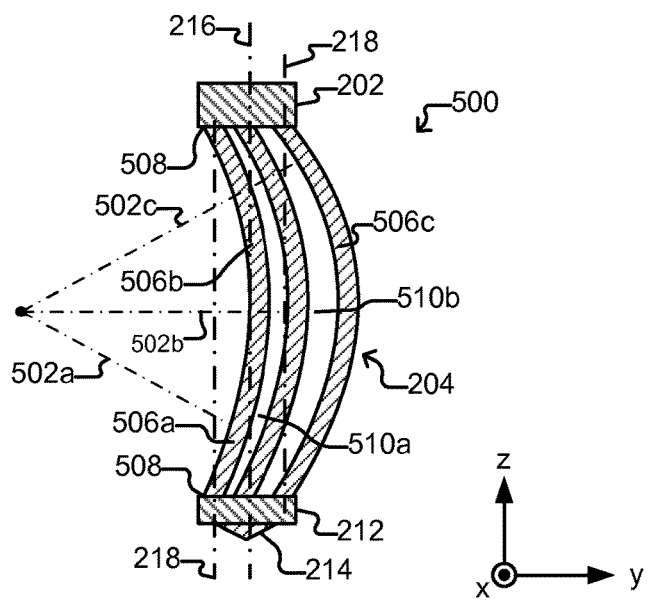
FIG. 5 illustrates a variation of the vertical contact element of FIGS. 2A and 2B in which the leaves of the body are not spaced a uniform distance apart according to some embodiments of the invention.

FIG. 5 illustrates a vertical contact element 500 comprising a first base end 202, body 204, and second base end 212 with contact tip 214 that can be the same as like named and numbered elements of contact element 200. Contact element 500 can be an electrically conductive, non-linear (e.g., responds to force as illustrated in FIGS. 3A-4 and discussed above), vertical contact element as discussed above (first base end 202 and contact 204 are on axis 216). As shown, body 204 can comprise leaves 506a, 506b, and 506c, which, with some exceptions noted below, can be the same as or similar to leaves 206. For example, in some embodiments, each leaf 506a, 506b, and 506c can be offset from axis 218 passing through leaf ends 508 generally as discussed above. As illustrated in FIG. 5, each leaf 506a, 506b, and 506c, however, can have a different radius of curvature. For example, leaf 506a can have a radius of curvature 502a, leaf 506b can have a radius of curvature 502b, and leaf 506c can have a radius of curvature 502c. In the example shown in FIG. 5, the radius of curvature 502c can be greater than the radius of curvature 502b, which can be greater than the radius of curvature 502a. This can result in the spacing 510b between leaves 506c and 506b being greater (e.g., 1.1, 1.25, 1.5, 1.75, 2, times or more) than the spacing 510a between leaves 506b and 506a. Alternatively, two or more of the radii of curvatures 502a, 502b, and/or 502c can be equal. For example, the leaves 206 in FIGS. 2A and 2B are illustrated as having substantially equal radii of curvature. Regardless, as shown, each radius of curvature 502a, 502b, and 502c can be from a common point. Alternatively, each radius of curvature 502a, 502b, and 502c can be from a different point (not shown). As noted above, there can be more or fewer than three leaves 506a, 506b, and 506c, and there can thus be a corresponding different number of radii of curvature 502a, 502b, and 502c and spacings 510a and 510b between adjacent leaves.

Figure 6:
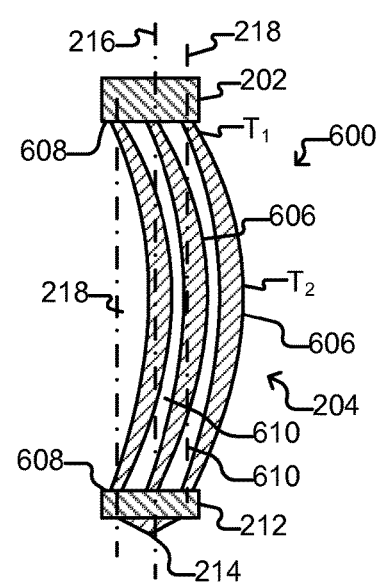
FIG. 6 illustrates a variation of the vertical contact element of FIGS. 2A and 2B in which the thickness of the leaves of the body vary according to some embodiments of the invention.

FIG. 6 illustrates a vertical contact element 600 comprising a first base end 202, body 204, and second base end 212 with contact tip 214 that can be the same as like named and numbered elements of contact element 200. Contact element 600 can be an electrically conductive, non-linear (e.g., responds to force as illustrated in FIGS. 3A-4 and discussed above), vertical contact element as defined above (first base end 202 and contact 204 are on axis 216). As shown, body 204 can comprise leaves 606, which, with some exceptions noted below, can be the same as or similar to leaves 206. As illustrated in FIG. 6, however, the thickness of each leaf 606 can vary. For example, the thickness $T_1$ of each leaf 606 can be smaller near ends 608 than the thickness $T_2$ near the middle of each leaf 606. For example, the thickness $T_2$ can be 1.1, 1.25, 1.5, 1.75, 2, or more times the thickness $T_1$. Although thickness $T_2$ is shown in FIG. 6 as greater than thickness $T_1$, $T_1$ can alternatively be greater than thickness $T_2$ for one or more of leaves 606. As yet another alternative, one or more of leaves 606 can alternatively have a generally uniform thickness (e.g., like each of leaves 206 in FIGS. 2A and 2B) while one or more leaves 606 have a varying thickness as illustrated in FIG. 6. As still another alternative, the stiffness of a leaf 606 near one or both ends 608 can be made to be greater or less than the stiffness of the leaf 606 near the middle. This can be accomplished, for example, by varying the thickness of the leaf 606 or providing slits, holes, or the like to vary the stiffness. Regardless, the stiffness or the thickness of a leaf 606 can vary smoothly or incrementally along the leaf 606. The stiffness or thickness of a leaf 606 can also vary in one or more undulations along the leaf in which each undulation varies from stiffer to less stiff and back to stiffer (e.g., thick to thin and back to thick) or vice versa. There can, of course, be fewer or more than three leaves 606 and thus a corresponding different number of spacings 610 between adjacent leaves 606

Figure 7:
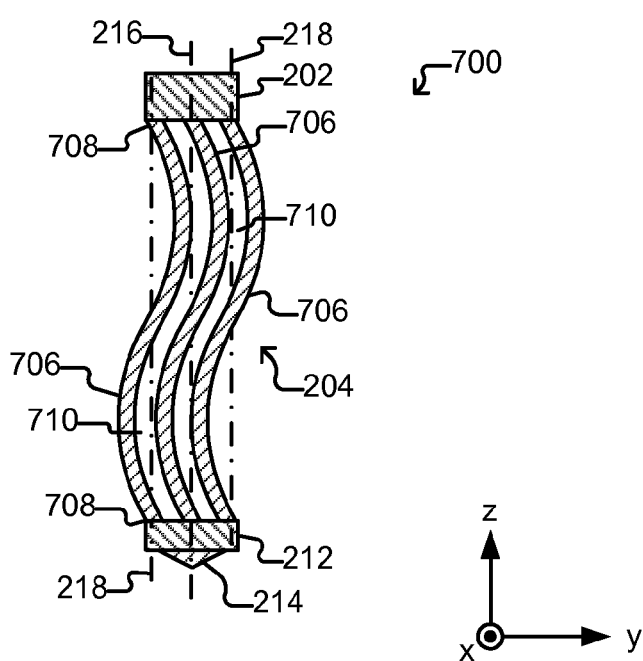
FIG. 7 illustrates a variation of the vertical contact element of FIGS. 2A and 2B according to some embodiments of the invention.

As illustrated in FIG. 7, the leaves of body 204 can be shapes other than simple curves. FIG. 7 illustrates a vertical contact element 700 comprising a first base end 202, body 204, and second base end 212 with contact tip 214 that can be the same as like named and numbered elements of contact element 200. Contact element 700 can be an electrically conductive, non-linear (e.g., responds to force as illustrated in FIGS. 3A-4 and discussed above), vertical contact element as defined above (first base end 202 and contact 204 are on axis 216). As shown, body 204 can comprise leaves 706, which, with some exceptions noted below, can be the same as or similar to leaves 206. For example, leaves 706 can have a general "S" shape as illustrated in FIG. 7. As shown, each leaf 706 can comprise an upper portion that is offset in one direction from an axis 218 passing through ends 202 and 212 of the leaf 706 and a lower portion that is offset in an opposite direction from the axis 218 passing through the ends 202 and 212 of the leaf 706.

The body 204 can be configured so that there are generally equal lateral (in the "x,y" plane) forces produced as the leaves 706 compress and then buckle. For example, the upper portion of each leaf 706 that is offset in one direction from axis 218 passing through ends 708 of the leaf 706 can be the same as the lower portion of each leaf 706 offset in the opposite direction from axis 218. Generally equal but opposite forces—and thus a net force of substantially zero—can thus be produced on each leaf 706 as the leaf compresses and then buckles. Alternatively, the body 204 can be configured so that there are generally unequal lateral (in the "x,y" plane) forces produced as the leaves 706 compress and then buckle. For example, the upper portion of each leaf 706 that is offset in one direction from axis 218 can be configured to produce a larger or smaller force than the lower portion of each leaf 706 offset in the opposite direction from an axis 218 passing through ends 708 of the leaf 706. Unequal forces can thus be produced on each leaf 706 as the leaf compresses and then buckles, which can result in lateral (in the "x,y" plane) movement of the second base end 212 and thus tip 214. As noted regarding other examples of contact elements, contact element 700 can have more or fewer than three leaves 706 and thus a corresponding different number of spacings 710 between adjacent leaves 706. Moreover, each leaf 706 is illustrated with an upper section disposed on one side of an axis 218 passing through ends 708 of the leaf 706 and a lower section disposed on an opposite side of the axis 218. Each leaf 706 can alternatively include more than two such sections each disposed on alternating opposite sides of an axis 218 passing through ends 708 of the leaf 706.

Figure 8:
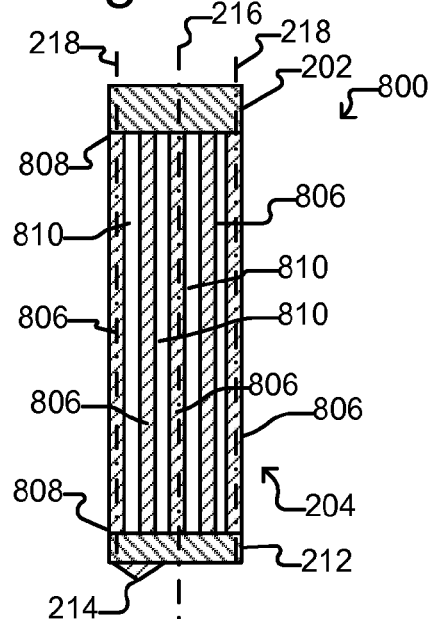
FIG. 8 illustrates a variation of the vertical contact element of FIGS. 2A and 2B in which the leaves of the body are not offset according to some embodiments of the invention.

As illustrated in FIG. 8, body 204 need not comprise leaves 806 that are curved. FIG. 8 illustrates a vertical contact element 800 comprising a first base end 202, body 204, and second base end 212 with contact tip 214 that can be the same as like named and numbered elements of contact element 200. Contact element 800 can be an electrically conductive, non-linear (e.g., responds to force as illustrated in FIGS. 3A-4 and discussed above), vertical contact element as defined above (first base end 202 and contact 204 are on or aligned on axis 216). As shown, body 204 can comprise leaves 806, which, with some exceptions noted below, can be the same as or similar to leaves 206. For example, the body of each leaf 806 can be disposed substantially on an axis 218 passing through opposite ends 806 of the leaf 806. There can be more or fewer than five leaves 806 and thus a corresponding different number of spacings 810 between adjacent leaves 806.

Figure 9:
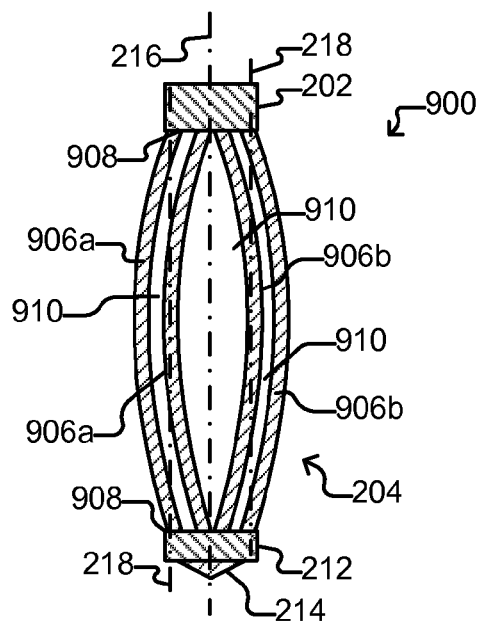
FIG. 9 illustrates a variation of the vertical contact element of FIGS. 2A and 2B in which the leaves of the body are offset in different directions according to some embodiments of the invention.

FIG. 9 also illustrates an example in which contact tip 214 is offset and thus not centered on the second base end 212. This can cause the second base end 212 to move laterally (in the "x,y" plane) as the leaves 806 compress and then buckle. Such lateral movement can include rotation about the "x" axis, the "y" axis, and/or the "z" axis.

As illustrated in FIG. 9, body 204 need not comprise leaves that are disposed in a same direction. FIG. 9 illustrates a vertical contact element 900 comprising a first base end 202, body 204, and second base end 212 with contact tip 214 that can be the same as like named and numbered elements of contact element 200. Contact element 900 can be an electrically conductive, non-linear (e.g., responds to force as illustrated in FIGS. 3A-4 and discussed above), vertical contact element as defined above (first base end 202 and contact 204 are on axis 216). As shown, body 204 can comprise leaves 906a and 906b, which, with some exceptions noted below, can be the same as or similar to leaves 206. For example, one or more of the leaves 906a and 906b can be offset from an axis 218 passing through leaf ends 908 as discussed above. As illustrated in FIG. 9, however, leaves 906a and 906b need not be offset from their axis 218 in the same direction. For example, as shown in FIG. 9, each of leaves 906a can be offset from an axis 218 passing through its ends 908 in one direction, and each of leaves 906b can be offset from an axis passing through its ends 908 in an opposite direction. The leaves 906a can be generally equal but opposite the leaves 906b so that lateral (in the "x,y" plane) forces as leaves 906a compress and then buckle are generally equal but opposite to—and thus cancel—lateral forces as leaves 906b compress and then buckle. This can result in little to no lateral movement of the second base end 212 and thus tip 214. Alternatively, leaves 906a can be different (e.g., different stiffness, thickness, material, or the like) than leaves 906b so that there is a net lateral force as leaves 906a and 906b compress and then buckle, causing tip 214 to move laterally. Regardless, there can be more or fewer than four leaves 906a and 906b and thus a corresponding different number of spacings 910 between adjacent leaves 906a and 906b.

Figure 10:
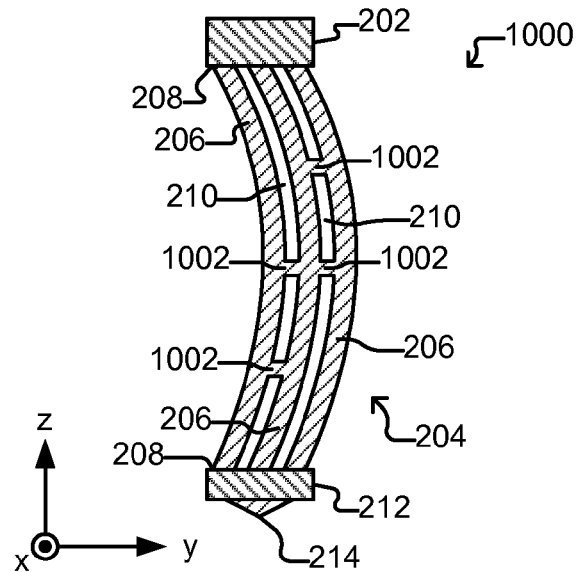
FIG. 10 illustrates a variation of the vertical contact element of FIGS. 2A and 2B in which the leaves of the body are coupled by tie bars according to some embodiments of the invention.

FIG. 10 illustrate yet another variation of contact element 200. As shown, contact element 1000 can be the same as contact element 200 except tie bars 1002 can be disposed between and connect adjacent leaves 206. Contact element 1000 can be an electrically conductive, non-linear (e.g., responds to force as illustrated in FIGS. 3A-4 and discussed above), vertical contact element as defined above (first base end 202 and contact 204 can be on or aligned on axis 216), and contact element 1000 can replace the contact elements 112 in FIG. 1. Tie bars 1002 can be disposed between adjacent leaves 206 in any pattern, and there can thus be a different number of tie bars 1002 than shown in FIG. 10. Moreover, tie bars 1002 can be in different locations than shown in FIG. 10. There can be more or fewer than three leaves 206.

As discussed above, FIGS. 7 and 9 illustrate examples in which leaves can be configured to result in a sum of lateral forces that are generally zero. On the other hand, in FIGS. 2A, 2B, 5, 6, and 10, a lateral force can arise generally in the direction of the offset of the leaves as the contact elements 200, 500, 600, and 1000 of those figures compress and then buckle. The contact elements 200, 500, 600, and 1000 illustrated in FIGS. 2A, 2B, 5, 6, and 10 can be arranged, however, so that the lateral force on one contact element is substantially equal but opposite to the lateral force on another contact element. For example, multiple contact elements 200, 500, 600, and/or 1000 can be arranged so that a first half of the contact elements are oriented such that lateral forces on the first half of the contact elements are in one direction and a second half of the contact elements are oriented such that generally equal but opposite lateral force are on the second half of the contact elements. In this manner, the sum of the lateral forces on all of the contact elements can be generally zero.

The variations of contact element 200 illustrated in FIGS. 6-10 are examples only, and contact element 200 can include those and/or other variations. For example, one or more of the leaves 206 need not be curved or comprise curves but can have other shapes such as connected straight line segments. Moreover, all of the leaves 206 of a contact element 200 need not be offset in the same direction; rather, some or all of leaves 206 can each be offset in a different direction. For example, referring to FIG. 2B, one leaf 206 can be offset from its axis 218 in one direction along the "y" axis, and another leaf 206 can be offset from its axis 218 in an opposite direction along the "y" axis. As another example, one or more of the leaves 206 of contact element 200 can comprise multiple different connected line segments oriented in different directions, multiple different connected splines, multiple different connected curves, or combinations of the forgoing. As still another example, contact tip 214 can be displaced from the axis 216 that passes through the first base end 202 and the second base end 212, which can cause even contact elements like 700 and 800 to buckle in a desired direction.

Moreover, the examples of variations illustrated in FIGS. 5-10 can be combined. For example, a thickness or stiffness of one or more of leaves 506a, 506b, and/or 506c in FIG. 5 can vary like leaves 606 in FIG. 6 and/or there can be tie bars 1002 between leaves 506a, 506b, and 506c as in FIG. 10. As another example, the radius of curvature of leaves 606 in FIG. 6 can be different as in FIG. 5 and/or there can be tie bars 1002 between leaves 606 in FIG. 6 as in FIG. 10. As yet another example, a thickness or stiffness of one or more of leaves 706 in FIG. 7 can vary like leaves 606 in FIG. 6, and/or there can be tie bars 1002 between leaves 706 in FIG. 7 as in FIG. 10. As still another example, a thickness or stiffness of one or more of leaves 806 in FIG. 8 can vary like leaves 606 in FIG. 6, and/or there can be tie bars 1002 between leaves 806 in FIG. 8 as in FIG. 10. As yet further examples, contact element 900 of FIG. 9 can incorporate any of the variations illustrated in FIGS. 5, 6, 7, 8, and/or 10, and contact element 1000 of FIG. 10 can likewise incorporate any of the variations illustrated in FIGS. 5, 6, 7, 8, and/or 9.

The different possible features of contact element 200 illustrated in FIGS. 5-10 can, among other things, vary the different force-to-displacement response (e.g., as illustrated in FIG. 4) functions 402 and 406 of the contact elements. For example, the different radii of curvature 502a, 502b, and 502c of the contact element 500 in FIG. 5 can result in particular force-to-displacement response functions 402 and 406 of contact element 500. Similarly, the varying thicknesses of the leaves 606 of the contact element 600 of FIG. 6, and the shapes of the leaves 706 can affect the force-to-displacement response functions 402 and 406 of those contact elements 600 and 700. Likewise, the number and placement of tie bars 1002 in the contact elements 1000 in FIG. 10 can affect the force-to-displacement response functions 402 and 406 of contact element 1000. The force-to-displacement response functions 402 and 406 of a probe can thus be tailored to the needs of a particular application.

Contact elements 200 (including any variation of contact elements 200 discussed above such as contact elements 500, 600, 700, 800, 900, and/or 1000) can be made in any suitable manner. (All references herein to a contact element 200 or contact elements 200 include all variations of contact elements 200 discussed above such as contact elements 500, 600, 700, 800, 900, and/or 1000.) FIGS. 11A-14 illustrate an example of a lithographic process for making contact elements 200. Such lithographic process can be used to make contact elements 200 that are micro-sized. For example, in some embodiments, such a lithographic process can be used to make contact elements 200 sufficiently small to contact terminals 116 of DUT that, as discussed above, can be spaced as close together as two-hundred microns, one-hundred microns, ninety microns, eighty microns, fifty microns, or less, although the spacing between adjacent terminals 116 in other embodiments can be greater than two-hundred microns.

Figure 11A:
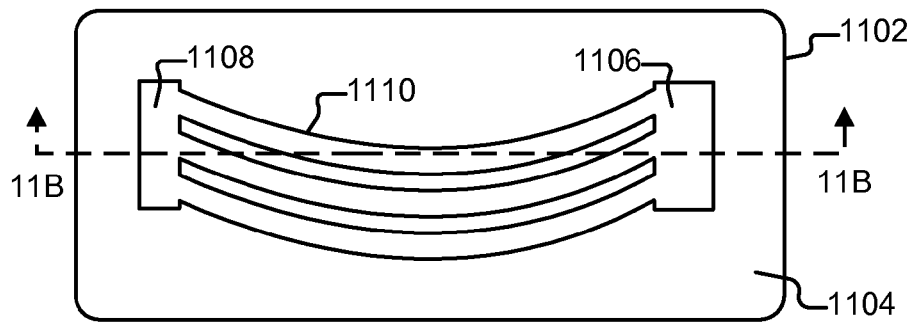
FIGS. 11A-14 illustrate a lithographic process for making a vertical contact element comprising a body of spaced leaves according to some embodiments of the invention.
Figure 11B:
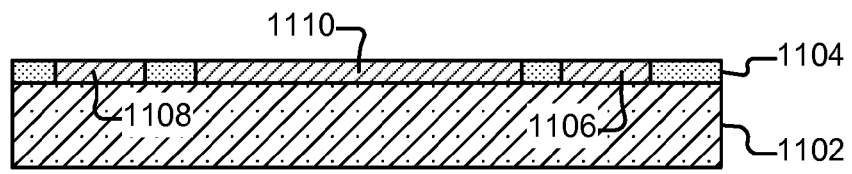

As shown in FIGS. 11A and 11B, a masking material 1104 can be deposited on a substrate 1102 and patterned to have openings that are then filled with a material to form first base portion 1106, leaf portion 1110, and second base portion 1108. As will be seen, first base portion 1106 can be part of the first base end 202 of contact element 200, leaf portion 1110 can be part of the leaves 206 of contact element 200, and second base portion 1108 can be part of second base end 212.

Masking material 1104 can be a material that is readily deposited on substrate 1102 and patterned to have such openings. A non-limiting example of masking material 1104 can be a photoresist material. The material deposited into the openings to form first base portion 1106, leaf portion 1110, and second base portion 1108 can be material suitable for the first base end 202, leaves 206, and second base end 212 of contact element 200. Non-limiting examples of such materials include electrically conductive metals. The material deposited into the openings can be the same material for each of the first base portion 1106, leaf portion 1110, and second base portion 1108, or the material deposited into the openings can be different material for one or more of the first base portion 1106, leaf portion 1110, and/or second base portion 1108. As yet another alternative, multiple materials can be deposited (e.g., in layers) into the openings for each of one or more of the first base portion 1106, leaf portion 110, and second base portion 1108. For example, one or more materials with desired mechanical properties (e.g., spring properties) and one or more materials with desired electrical properties can be deposited.

Regardless, the material deposited into the openings in masking material 1104 to form the first base portion 1106, leaf portion 1110, and second base portion 1108 can be deposited into the openings in masking material 1104 in any suitable manner. For example, there can be an electrically conductive seed layer (not shown) between substrate 1102 and masking material 1104, which is exposed through the openings in the masking material 1104. The material of the first base portion 1106, leaf portion 1110, and second base portion 1108 can be electroplated onto the exposed seed layer (not shown). Alternatively, the material of the first base portion 1106, leaf portion 1110, and second base portion 1108 can be deposited into the openings in the masking material 1104 in other ways such as sputter deposition, physical vapor deposition, chemical vapor deposition, electroless plating, electron beam deposition, thermal evaporation, or the like.

Figure 12A:
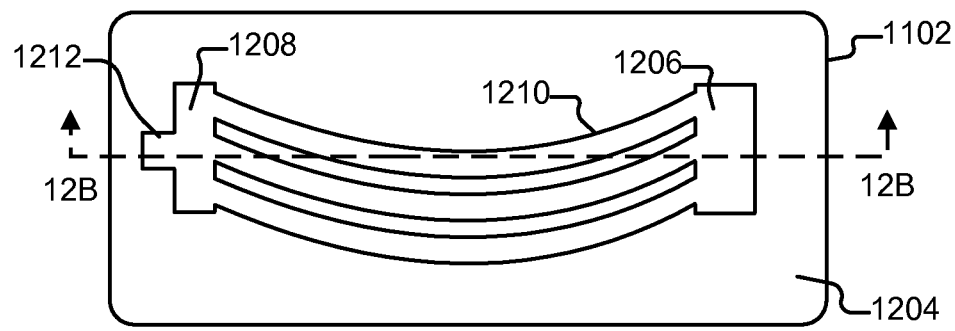
Figure 12B:
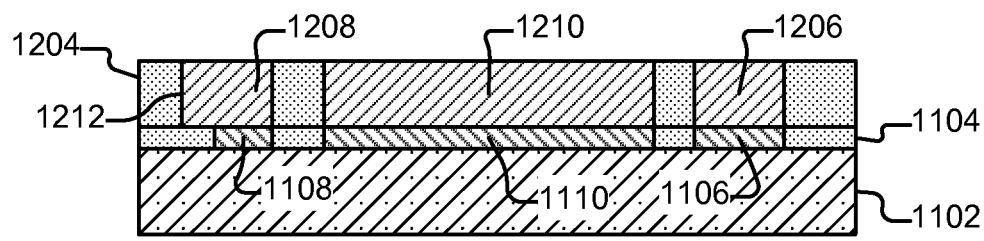

As shown in FIGS. 12A and 12B, a masking material 1204 can be deposited on masking material 1104, first base portion 1106, leaf portion 1110, and second base portion 1108 and patterned to have openings that are then filled with a material to form first base portion 1206, leaf portion 1210, second base portion 1208, and contact tip 1212. As will be seen, first base portion 1206 can be part of the first base end 202 of contact element 200, leaf portion 1210 can be part of the leaves 206 of contact element 200, second base portion 1208 can be part of second base end 212, and contact tip 1212 can correspond to contact tip 214.

Masking material 1204 can be the same as or similar to masking material 1104. The material deposited into the openings to form the first base portion 1206, leaf portion 1210, second base portion 1208, and contact tip 1212 can be material suitable for the contact tip 214, leaves 212, first base end 202, and second base end 212 of contact element 200. Non-limiting examples of such materials include electrically conductive metals. The material deposited into the openings can be the same material for each of the first base portion 1206, leaf portion 1210, second base portion 1208, and contact tip 1212, or the material deposited into the openings can be different material for one or more of the first base portion 1206, leaf portion 1210, second base portion 1208, and/or contact tip 1212.

The material deposited into the openings in masking material 1204 to form the first base portion 1206, leaf portion 1210, second base portion 1208, and contact tip 1212 can be deposited into the openings in masking material 1204 in any suitable manner including any of the ways discussed above for depositing the material that forms base portion 1106, leaf portion 1110, and contact portion 1108 in the openings in masking material 1104. For example, an electrically conductive seed layer (not shown) can be deposited between masking material 1104, base portion 1106, leaf portion 1110, and contact portion 1108, on one hand, and masking material 1204, on the other hand. That seed layer (not shown) can be exposed through the openings in the masking material 1204, and the material of the first base portion 1206, leaf portion 1210, second base portion 1208, and contact tip 1212 can be electroplated onto the exposed seed layer (not shown). Alternatively, the material of the first base portion 1206, leaf portion 1210, second base portion 1208, and contact tip 1212 can be deposited into the openings in the masking material 1204 in other ways such as sputter deposition, physical vapor deposition, chemical vapor deposition, electroless plating, electron beam deposition, thermal evaporation, or the like.

Figure 13A:
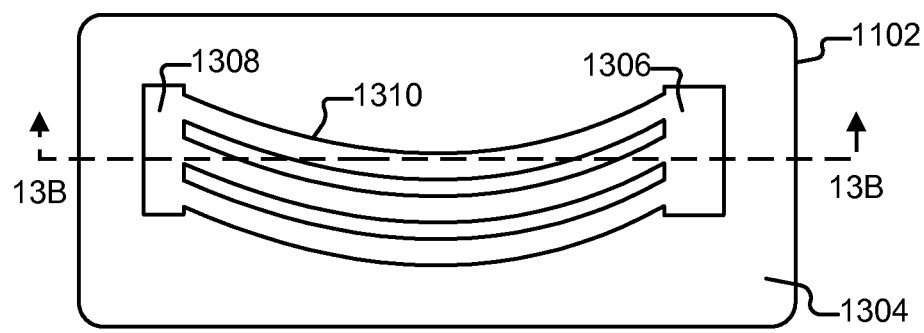
Figure 13B:
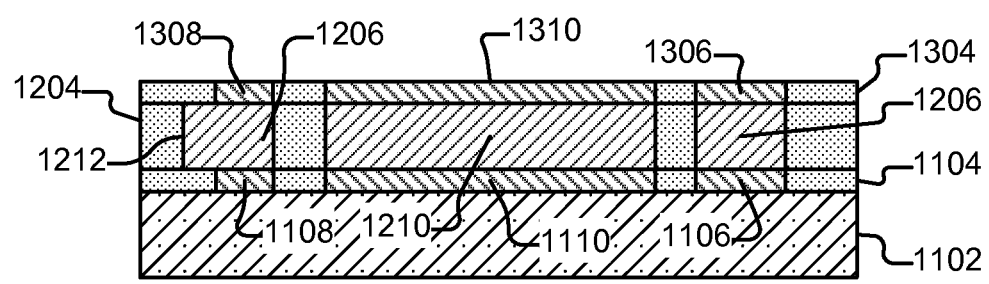

As shown in FIGS. 13A and 13B, a masking material 1304 can be deposited on masking material 1204 and the first base portion 1206, leaf portion 1210, second base portion 1208, and contact tip 1212 and patterned to have openings that are then filled with a material to form base portion 1306, leaf portion 1310, and contact portion 1308. As will be seen, first base portion 1306, leaf portion 1310, and second base portion 1308 can be part of the first base end 202, leaves 206, and second base end 212 of contact element 200.

Masking material 1304 can be the same as or similar to masking material 1104 or 1204. The material deposited into the openings to form the first base portion 1306, leaf portion 1310, and second base portion 1308 can be material suitable for the first base end 202, leaves 206, and second base end 212 of contact element 200. Non-limiting examples of such materials include electrically conductive metals. The material deposited into the openings can be the same material for each of the first base portion 1306, leaf portion 1310, and second base portion 1308, or the material deposited into the openings can be the different material for one or more of the first base portion 1306, leaf portion 1310, and/or second base portion 1308.

The material deposited into the openings in masking material 1304 to form the first base portion 1306, leaf portion 1310, and/or second base portion 1308 can be deposited into the openings in masking material 1304 in any suitable manner including any of the ways discussed above for depositing the material that forms base portion 1106, leaf portion 1110, and contact portion 1108 in the openings in masking material 1104. For example, an electrically conductive seed layer (not shown) can be deposited between masking material 1204 and the first base portion 1206, leaf portion 1210, second base portion 1208, and contact tip 1212, on one hand, and masking material 1304, on the other hand. That seed layer (not shown) can be exposed through the openings in the masking material 1304, and the material of the first base portion 1306, leaf portion 1310, and second base portion 1308 can be electroplated onto the exposed seed layer (not shown). Alternatively, the material of the material of the first base portion 1306, leaf portion 1310, and second base portion 1308 can be deposited into the openings in the masking material 1304 in other ways such as sputter deposition, physical vapor deposition, chemical vapor deposition, electroless plating, electron beam deposition, thermal evaporation, or the like.

Figure 14:
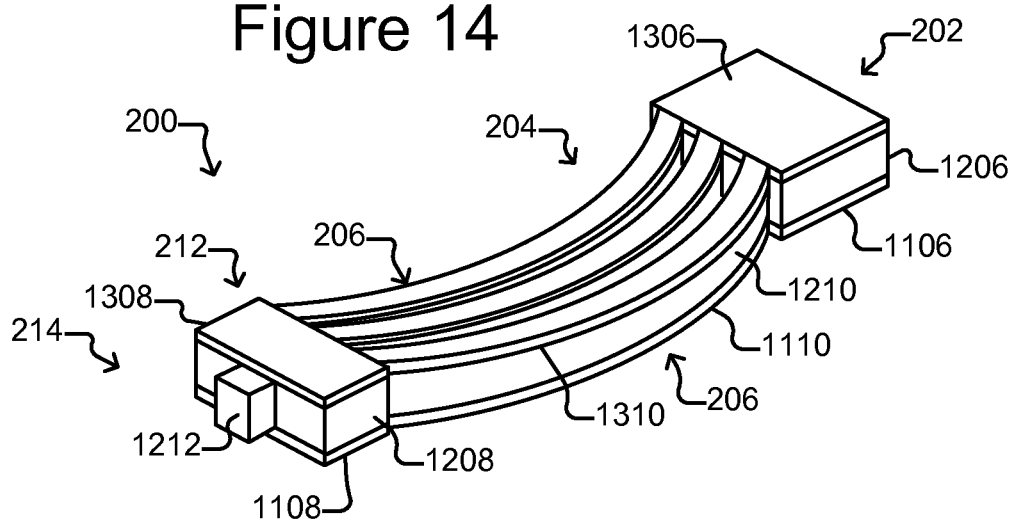

Masking materials 1104, 1204, and 1304 can be removed and the base portion 1106, leaf portion 1110, and contact portion 1108 can be released from substrate 1102. The result can be, as shown in FIG. 14, contact element 200. As shown, the first base end 202 can comprise first base portions 1106, 1206, and 1306; the leaves 206 can comprise leaf portions 1110, 1210, and 1310; and second base end 212 can comprise second base portions 1208, 1208, and 1308. Contact tip 214 can comprise contact tip 1212 formed during the process illustrated in FIGS. 11A-13A. Alternatively, contact tip 214 can be formed separately and then attached to second base end 212.

As another example of a variation of the contact element 200, any of the leaf portions 1110, 1210, and/or 1310 can comprise more than one material. As yet another example, leaves 206 can be made of different materials. For example, two or more or all of leaf portions 1110, 1210, and 1310 can comprise different materials. As still another example, although contact element 200 is illustrated in FIG. 14 as comprising three layers, contact element 200 can alternatively comprise a different number of layers (e.g., one, two, four, five, six, seven, eight, nine, or more layers). As yet another example, not all portions, materials, and/or layers of contact element 200 need be electrically conductive. Moreover, some portions, materials, and/or layers of contact element 200 can be better electrical conductors than other portions, materials, and/or layers.

FIGS. 15A-21 illustrate another example of a process for making contact elements 200.

Figure 15A:
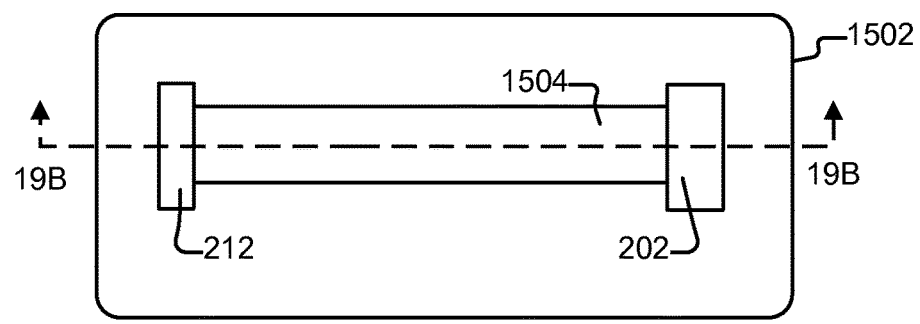
FIGS. 15A-19 illustrate another process for making a vertical contact element comprising a body of spaced leaves according to some embodiments of the invention.
Figure 15B:
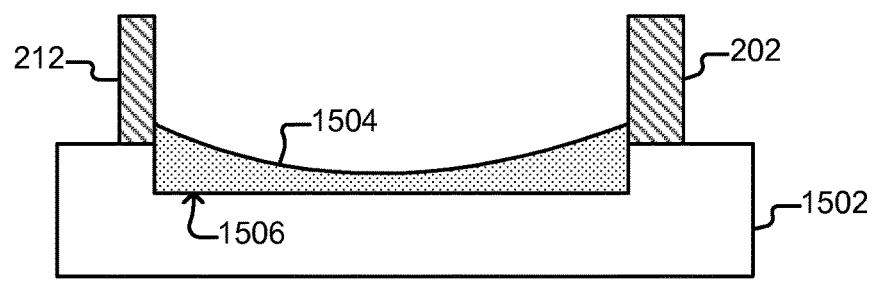

As shown in FIGS. 15A and 15B, first base end 202 and second base end 212 can be fabricated on or otherwise disposed on a substrate 1502, and a shaped surface 1504 can be provided between first base end 202 and second base end 212. The surface 1504 can be shaped in a desired shape of a leaf 206, which as will be seen, can be fabricated on shaped surface 1504. As shown, a trench 1506 can be provided in substrate 1502 to allow, if desired, shaped surface to extend below a surface of substrate 1502. Alternatively, first base end 202 and second base end 212 can be disposed on risers that extend above the surface of substrate 1502. As yet another alternative, surface 1504 can be formed into substrate 1502 itself.

Regardless, shaped surface 1504 can be formed in any suitable manner for making a shaped surface between first base end 202 and second base end 212. For example, shaped surface 1504 can be a surface of a masking material, which can be like masking material 1104, 1204, or 1304. Such masking material can be stamped or molded to produce shaped surface 1504. As another example, such masking material can be deposited (e.g., in a liquid or near liquid state) between first base end 202 and second base end 212 so as to form a meniscus in the desired shape of shaped surface 1504 and then hardened. As another example, rather than being a surface of a masking material, shaped surface 1504 can be a surface of a sheet of flexible material (e.g., metal, plastic, or the like) disposed between first base end 202 and second base end 212.

Figure 16A:
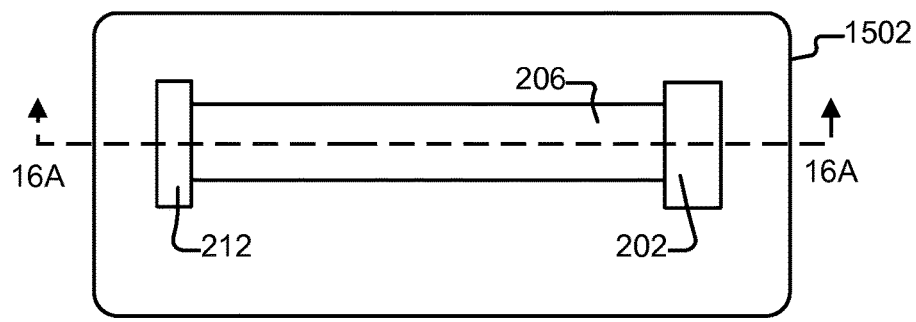
Figure 16B:
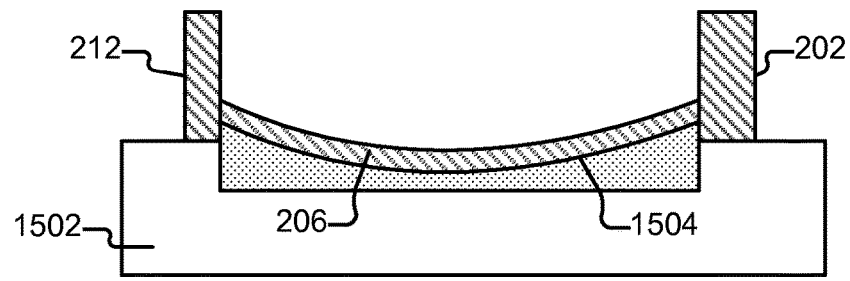

As shown in FIGS. 16A and 16B, a leaf 206 can be formed on shaped surface 1504, for example, by depositing material of leaf 206 onto shaped surface 1504. The material of leaf 206 can be deposited onto shaped surface 1504 in any suitable manner. For example, the material of leaf 206 can be deposited onto shaped surface 1504 by electroplating, chemical vapor deposition, or the like. If material of leaf 206 is electroplated, shaped surface 1504 can be electrically conductive. For example, shaped surface 1504 can comprise an electrically conductive material, or there can be an electrically conductive seed layer (not shown) on shaped surface 1504.

Regardless of how deposited, the material deposited onto shaped surface 1504 to form leaf 206 can be material suitable for a leaf 206 of contact element 200. Non-limiting examples of such materials include electrically conductive metals. The material deposited onto shaped surface 1504 to form leaf 206 can be the same material as the material of the first base end 202 and/or the second base end 212 or can be a different material. Moreover, the material deposited onto shaped surface 1504 can be deposited as one layer or multiple layers, which can comprise the same or different materials. For example, the contact element 200 can comprise multiple materials, one or more of which can be selected for mechanical characteristics such as spring characteristics, and one or more of which can be selected for electrical characteristics. Moreover, as noted above, some portions, materials, and/or layers of contact element 200 need not be electrically conductive. Alternatively, some portions, materials, and/or layers of contact element 200 can be better electrical conductors than other portions, materials, and/or layers.

Figure 17A:
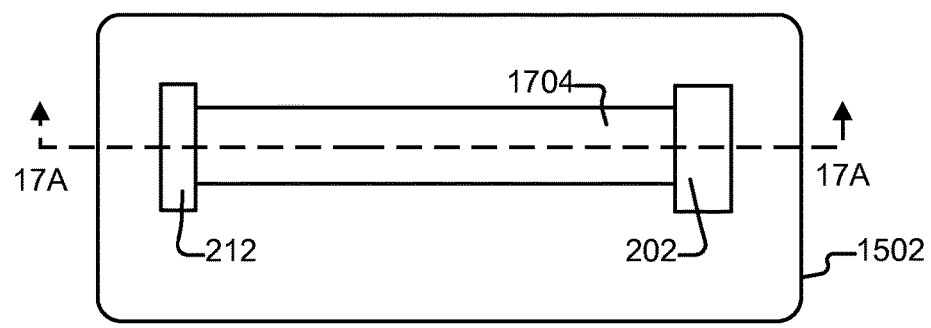
Figure 17B:
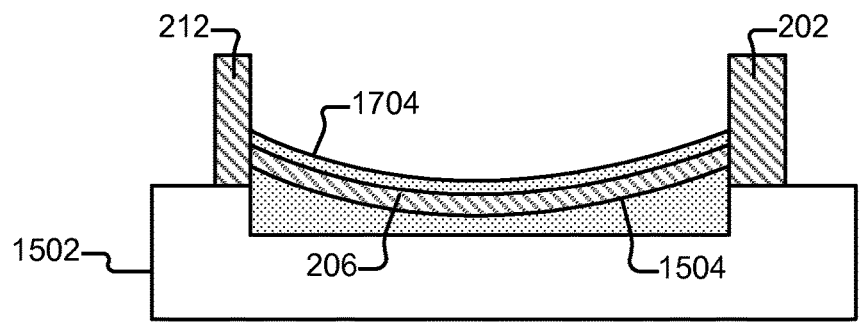

As shown in FIGS. 17A and 17B, another shaped surface 1704 can be provided over leaf 206 and between first base end 202 and second base end 212. Shaped surface 1704 can be formed in any suitable manner, including any of the ways of forming shaped surface 1504 discussed above. For example, shaped surface 1704 can be a surface of a masking material (e.g., like masking material 1104, 1204, or 1304), or shaped surface 1504 can be a surface of a sheet of flexible material (e.g., metal, plastic, or the like) disposed on leaf 206 and between first base end 202 and second base end 212.

Figure 18A:
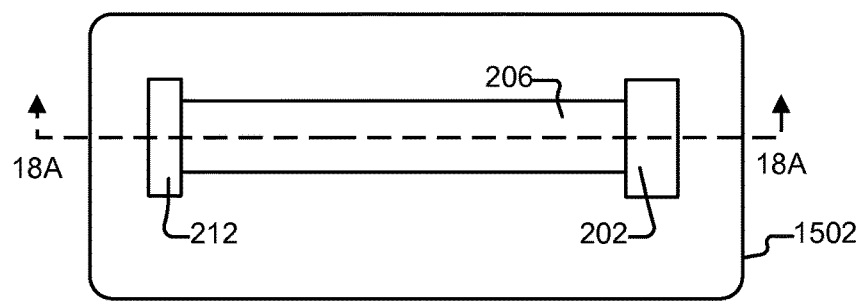
Figure 18B:
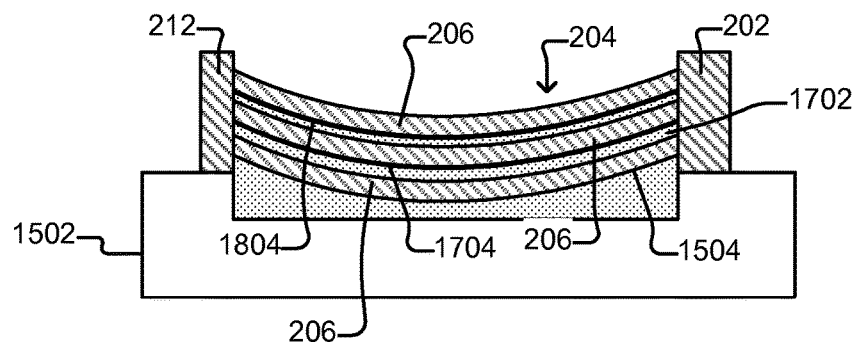

As shown in FIGS. 18A and 18B, another leaf 206 can be formed (e.g., in any of the ways discussed above for forming leaf 206 on shaped surface 1504) on shaped surface 1704. Another shaped surface 1804 can be provided (e.g., in any of the ways discussed above for providing shaped surface 1504 or 1704) over leaf 206 and between first base end 202 and second base end 212, and yet another leaf 206 can be formed (e.g., in any of the ways discussed above for forming leaf 206 on shaped surface 1504) on shaped surface 1804.

As shown in FIGS. 18A and 18B, leaf 206 can be formed on shaped surface 1804, for example, by depositing material of leaf 206 can be deposited onto shaped surface 1804. The material of leaf 206 can be deposited onto shaped surface 1804 in any suitable manner. For example, the material of leaf 206 can be deposited onto shaped surface 1804 by electroplating, chemical vapor deposition, or the like. If material of leaf 206 is electroplated, shaped surface 1804 can be electrically conductive. For example, shaped surface 1804 can comprise an electrically conductive material, or there can be an electrically conductive seed layer (not shown) on shaped surface 1804.

Figure 19:
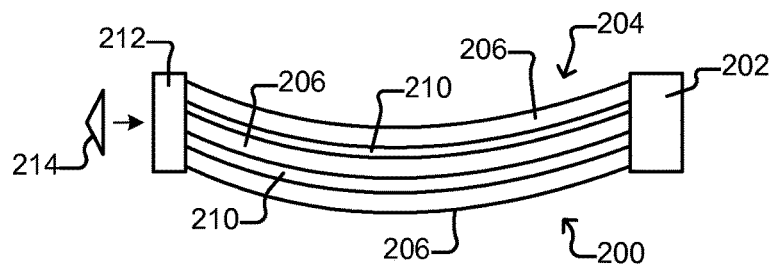

The material of shaped surfaces 1504, 1704, and 1804 can be removed (e.g., etched away) and the first base end 202 and second base end 212 can be separated from substrate 1502. The result can be, as shown in FIG. 19, contact element 200. Contact tip 214 can be formed during the process illustrated in FIGS. 15A-18B, or contact tip 214 can be formed separately and then attached to second base end 212 as illustrated in FIG. 19.

Figure 20A:
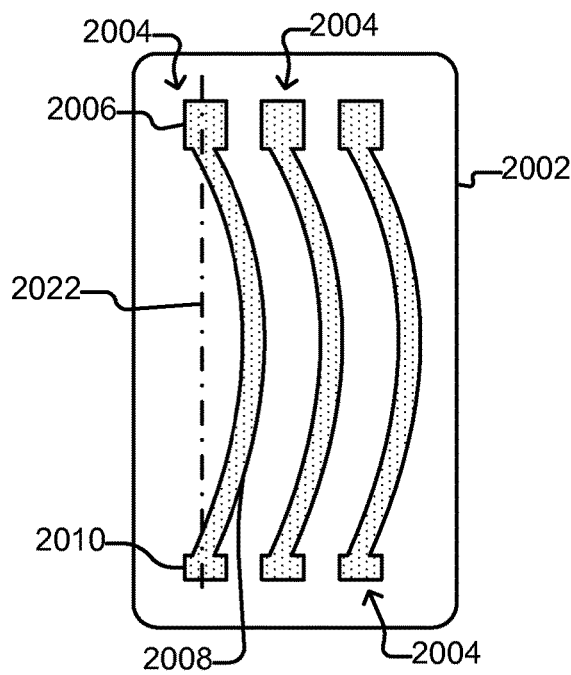
FIGS. 20A and 20B illustrate yet another process for making a vertical contact element comprising a body of space leaves.
Figure 20B:
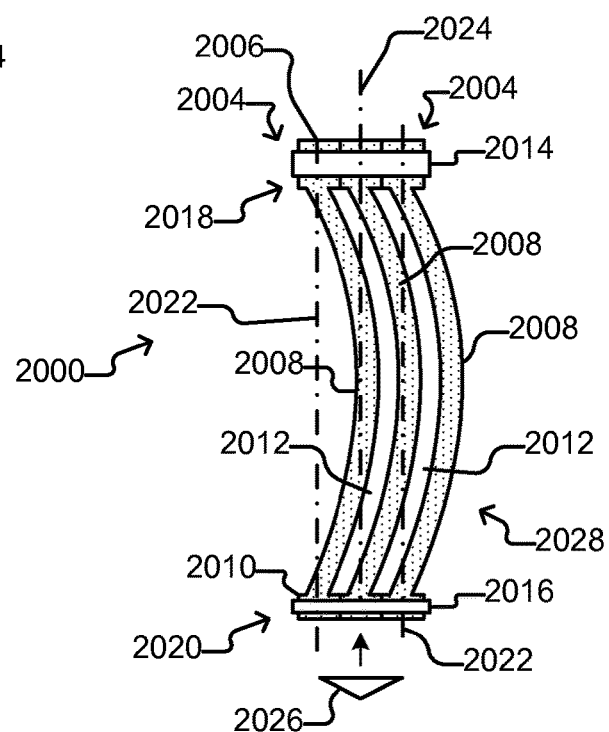

FIGS. 20A and 20B illustrate yet another example of a process for making a contact element like contact element 200. The resulting contact element 2000, which is illustrated in FIG. 20B, is another example of a variation of contact element 200, and contact element 2000 can replace each of contact elements 112 in the contactor 106 of FIG. 1.

As illustrated in FIG. 20A, contact pieces 2004 each comprising a first base portion 2006 and a second base portion 2010 and a leaf portion 2008 between the first base portion 2006 and the second base portion 2010 can be obtained. For example, contact pieces 2004 can be cut, stamped, etched, or otherwise form from a sheet 2002 of material (e.g., an electrically conductive material such as a metal). As another example, contact pieces 2004 can be formed on a substrate (not shown) and released from the substrate. As also shown in FIG. 20A, the leaf portion 2008 can be offset from an axis 2022 that passes through the first base portion 2006 and the second base portion 2010. For example, as illustrated in FIG. 20A, the majority of the volume or mass of leaf 2008 or the centroid of leaf 2008 can be displaced from axis 2022.

As shown in FIG. 20B, first base portions 2006 of more than one contact piece 2004 can be coupled together to form a contact element 2000. For example, first base portions 2006 can be coupled by a clasp 2014. Alternatively or in addition, first base portions 2006 can be coupled in other ways such as brazing, welding, soldering, or the like. As yet another example, first base portions 2006 can be coupled by being inserted into a hole in a plate such as a guide structure (not shown). Second base portions 2010 can also be coupled together by, for example, a clasp 2016. Second base portions 2010 can alternatively be coupled in other ways such as brazing, welding, soldering, or the like or by being inserted into a hole in a plate such as a guide structure (not shown).

Still referring to FIG. 20B, the resulting contact element 2000 can comprise a first base end 2018, a second base end 2020, and a body 2028 comprising leaves 2008. Contact element 2000 can thus be like contact element 200 of FIGS. 2A and 2B. That is, first base end 2018 of contact element 2000 can be like first base end 202 of contact element 200, contact 2018 of contact element 2000 can be like second base end 212 of contact element 200, and body 2028 with spaces 2012 between leaves 2008 of contact element 2000 can be like body 204 with spaces 210 between leaves 206 of contact element 200. As shown in FIG. 20B, contact element 2000 can also include a contact tip 2026, which can be formed separately and attached to second base end 2020 as shown or can be part of second base portions 2010 in FIG. 20A. Contact element 2000 can thus be like contact element 200, and making contact pieces 2004 as shown in FIG. 20A and coupling those contact pieces 2004 together as shown in FIG. 20B is thus an alternative process for making a contact element like contact element 200.

Contact element 2000 can be a vertical contact element. For example, the first base end 2018 and second base end 2020 of each of multiple contact elements 2000 can be on an axis 2024, which can be substantially perpendicular (as discussed above) to a contact plane of a contact tips 2026 of the contact elements 2000 as generally discussed above with respect to contact element 200 and FIGS. 2A and 2B. Contact element 2000 can first compress and then buckle in response to a force through the contact element 2000 generally as illustrated in FIGS. 3A-4 and discussed above with respect to those figures. For example, as shown by line 402, the force on contact end 2018 or contact end 2020 can increase in accordance with a function 402 as contact end 2018 or contact end 2020 is displaced in accordance with axial compression of body 2028. Body 2028 can bend or buckle at point 404, and thereafter the force on contact end 2018 or contact end 2020 can increase in accordance with a different function represented by line 406 generally as discussed above. Also, as noted above, the graph illustrated in FIG. 4 is an example only, and functions 402 and 406 can have different slopes and need not be linear, and buckling point 404 can be located at a different location.

Moreover, as shown in FIG. 20B, each leaf 2008 can be offset, as discussed above, from an axis 2022 that passes through the first base portion 2006 and the second base portion 2010 to which ends of the leaf 2008 are coupled. As illustrated in FIG. 20B and as generally discussed above with respect to contact element 200 and FIGS. 2A and 2B, all of the leaves 2008 can be offset in a same direction.

The contact element 2000 illustrated in FIG. 20B is an example only, and variations of course are possible. For example, any one or more of the variations illustrated in FIGS. 5-10 can be applicable to contact element 2000. For example, although leaves 2008 can each have substantially the same radius of curvature as generally shown in FIG. 20B, each leaf 2008 can have a different radius of curvature generally as illustrated in FIG. 5. One or more of leaves 2008 can have a varying width as illustrated in FIG. 6, a different shape as shown in FIG. 7, and/or tie bars between leaves 2008 like tie bars 1002 of FIG. 10. Similarly, leaves 2008 need not be offset in the same direction, for example, as illustrated in FIG. 7, nor need leaves be offset at all as generally shown in FIG. 8. Also, first base end 2018 can be coupled to a device such as contactor 106 in FIG. 1 or merely held in contact with or in proximity to such a device (e.g., contactor 106) as generally shown in and discussed above with respect to FIG. 9. Moreover, there can be fewer or more than the three leaves 2008 (and contact pieces 2004) illustrated in FIG. 20B.

Figure 21A:
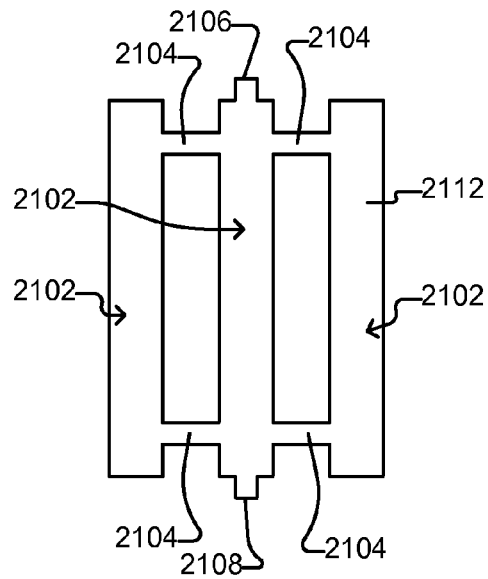
FIGS. 21A-21C illustrate yet other processes for making a vertical contact element comprising a body of space leaves.
Figure 21B:
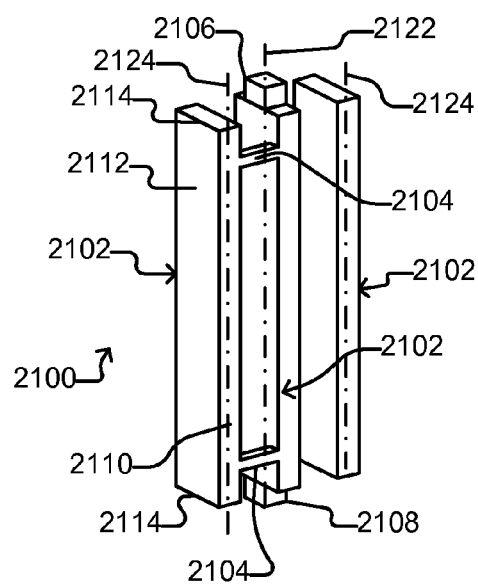
Figure 21C:
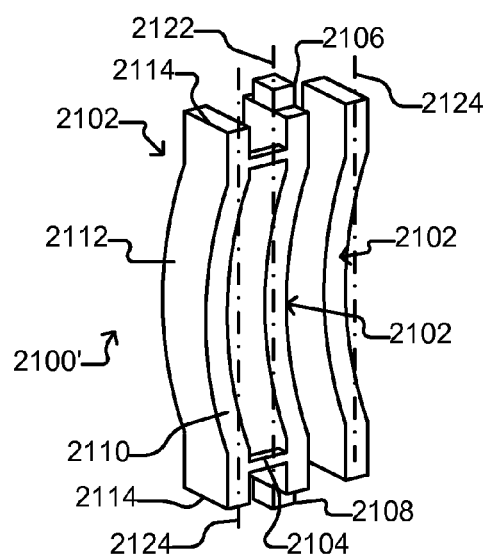

FIGS. 21A-21C illustrate yet another example of a process for making a contact element like contact element 200. The resulting contact element 2100 or 2100', which is illustrated in FIGS. 20B and 20C, is another example of a variation of contact element 200, and contact element 2100 or 2100' can replace each of contact elements 112 in the contactor 106 of FIG. 1.

As shown in FIG. 21A, a structure comprising multiple leaves 2102 (although three are shown there can be more or fewer) coupled by tie bars 2104 (of which there can be more or fewer than shown) can be obtained. For example, the structure shown in FIG. 21A can be cut, stamped, etched, or otherwise formed from a sheet (not shown) of material (e.g., an electrically conductive material such as a metal). Alternatively, the structure shown in FIG. 21A can be formed on and then released from a substrate (not shown). Regardless, as shown, one or more of the leaves 2102 can comprise base ends 2106 and 2108.

As shown in FIG. 21B, the leaves 2102 can be bent about tie bars 2104 and thus form a contact element 2100 comprising a stack of leaves 2102 connected by tie bars 2104. As shown faces 2112 of the leaves 2102 can be generally parallel in the stack, and tie bars 2104 can be generally perpendicular to the parallel leaves 2102 and generally perpendicular to the length of the leaves 2102 (which can be elongate along an axis 2124 as shown). As shown in FIG. 21C, leaves 2112 can be bent so that each leaf 2112 is offset from an axis 2114 passing through opposite ends 2114 of the leaf 2112, which can produce contact element 2100'.

Contact element 2100 of FIG. 21B or contact element 2100' can be an electrically conductive, non-linear (e.g., responds to force as illustrated in FIGS. 3A-4 and discussed above), vertical contact element. For example, base ends 2106 and 2108 of each of multiple contact elements 2100 or 2100' can be on an axis 2122, which can be substantially perpendicular (as discussed above) to a contact plane of base ends 2106 or 2108 as generally discussed above with respect to contact tips 214 of contact element 200 and FIGS. 2A and 2B. Moreover, as shown in FIG. 21C, each leaf 2112 can be offset, as discussed above, from an axis 2124 that passes through opposite ends 2114 of the leaf 2112. As illustrated in FIG. 21C and as generally discussed above with respect to contact element 200 and FIGS. 2A and 2B, in some embodiments, all of the leaves 2112 can be offset in a same direction.

Contact elements 2100 and 2100' can first compress and then buckle in response to a force through the contact element 2100 or 2100' generally as illustrated in FIGS. 3A-4. For example, as shown by line 402, the force on base end 2106 or 2108 can increase in accordance with a function 402 as 2106 or 2108 is displaced in accordance with axial compression of leaves 2102. Leaves 2102 can bend or buckle at point 404, and thereafter the force on 2106 or 2108 can increase in accordance with a different function represented by line 406 generally as discussed above. Also, as noted above, the graph illustrated in FIG. 4 is an example only, and functions 402 and 406 can have different slopes and need not be linear, and buckling point 404 can be located at different locations.

The contact element 2100 illustrated in FIG. 21B and contact element 2100' in FIG. 21C are examples only, and variations of course are possible. For example, any one or more of the variations illustrated in FIGS. 5-10 can be applicable to contact element 2100 or contact element 2100'. Although leaves 2112 of contact element 2100' can each have substantially the same radius of curvature as generally shown in FIG. 21C, each leaf 2112 can have a different radius of curvature generally as illustrated in FIG. 5. One or more of leaves 2112 in contact element 2100 of FIG. 21B or contact element 2100' of FIG. 21C can have a varying width as illustrated in FIG. 6 or a different shape as shown in FIG. 7. Leaves 2112 need not be offset in the same direction in contact element 2100' of FIG. 21C but can be offset in different directions, for example, as illustrated in FIG. 7. Moreover, there can be fewer or more than the three leaves 2112 in contact element 2100 of FIG. 21B or contact element 2100' of FIG. 21C.

As mentioned, vertical interconnection elements 200, 600, 700, 800, 900, 1000, 2000, 2100, and 2100' can be examples of interconnection elements 112 of the contactor 106 in FIG. 1 and can thus replacement interconnection elements 112 in FIG. 1. As also mentioned above, contactor 106 in FIG. 1 can be, among other devices, a probe card assembly. An example of such a probe card assembly 2200 is illustrated in FIG. 22. Probe card assembly 2200 of FIG. 22 can thus replace the contactor 106 in FIG. 1.

As shown in FIG. 22, probe card assembly 2200 can comprise electrical connectors 2204 that can make electrical connections with channels 104 in FIG. 1. Electrical connectors 2204, which are thus an example of interface 108 in FIG. 1, can be any connector suitable for making electrical connections with channels 104. For example, electrical connectors 1606 can comprise zero-insertion-force electrical connectors, pogo-pin pads, or the like. Alternatively, electrical connectors 2204 can be a contactor like, for example, contactor 2400 shown in FIGS. 24A and 24B.

As shown in FIG. 22, in some embodiments, probe card assembly 22 can also comprise a wiring substrate wiring substrate 2202, an interposer 2208, and a probe substrate 2216 with probes 2220 for contacting terminals 116 of DUT 114 (see FIG. 1). (Any of wiring substrate 2202, interposer substrate 2212, and/or probe substrate 2216 can be an example of a support substrate.) Probes 2220, which can extend from surface 2222 of probe substrate 2216, can thus be examples of contact elements 112 in FIG. 1, and contact tips of probes 2220 for contacting terminals 116 of DUT 114 can be disposed in contact plane 120 as discussed above with respect to FIG. 1. The probe substrate 2216, interposer 2208, and wiring substrate 202 can be coupled to each other by, for example, bolts, screws, clamps, brackets, or the like (not shown). The probe substrate 2216, interposer 2208, and wiring substrate 202 can be an example of contactor 106, and probe substrate 2216 can be an example of a support structure for probes 2220.

Wiring substrate 2202 can include electrically conductive paths 2206 (e.g., electrically conductive traces and/or vias) on and/or in wiring substrate 2202 from connectors 2204 through the wiring substrate 2202. Probe substrate 2216 can likewise include electrically conductive paths 2218 (e.g., electrically conductive traces and/or vias) on and/or in probe substrate 2216 through the probe substrate 2216 to probes 2220.

Interposer 2208 can comprise an interposer substrate 2212, electrically conductive interconnection elements 2210, and electrically conductive interconnection elements 2214. Interconnection elements 2210 can be electrically connected through the interposer substrate 2212 to interconnection elements 2214. Interconnection elements 2210 (which can be elastic structures) can contact and thereby make electrical connections with the electrical paths 2206 through the wiring substrate 2202, and interconnection elements 2214 (which can be elastic structures) can contact and thereby make electrical connections with the electrical paths 2218 through the probe substrate 2216. Interposer 2208 can thus provide elastic electrical connections between the electrical paths 2206 through the wiring substrate 2202 and the electrical paths 2218 through the probe substrate 2216. Electrical paths 2206, interposer 2208, and electrical paths 2218 can thus electrical connect connectors 2204 and probes 2220 and can thus be examples of electrical connections 110 in FIG. 1.

In the probe card assembly 2200 of FIG. 22, probes 2220 can be electrically conductive, non-linear (e.g., responds to force as illustrated in FIGS. 3A-4 and discussed above), vertical contact elements with bodies comprising leaves like contact elements 200, 500, 600, 700, 800, 900, 1000, 2000, 2100, and/or 2100' (including any variation thereof illustrated or discussed herein). Thus, any of contact elements 200, 500, 600, 700, 800, 900, 1000, 2000, 2100 and/or 2100' (including any variation thereof illustrated or discussed herein) can replace probes 2220 in probe card assembly 2200. Alternatively or in addition, interconnection elements 2210 and/or interconnection elements 2214 can be vertical contact elements with bodies comprising leaves like contact elements 200, 500, 600, 700, 800, 900, 1000, 2000, 2100 and/or 2100' (including any variation thereof illustrated or discussed herein). Thus, any of contact elements 200, 500, 600, 700, 800, 900, 1000, 2000, 2100 and/or 2100' (including any variation thereof illustrated or discussed herein) can replace interconnection elements 2210 and/or interconnection elements 2213 in probe card assembly 2200. As yet another alternative, interposer 2208 and probe substrate 2216 can be eliminated, and probes 2220 (e.g., configured as any of contact elements 200, 500, 600, 700, 800, 900, 1000, 2000, 2100, and/or 2100' or any variation thereof illustrated or discussed herein) can be coupled directly to ends of electrical connections in wiring substrate 2202. As noted above, configured as any of contact elements 200, 500, 600, 700, 800, 900, 1000, 2000, 2100 and/or 2100' (including any variation thereof illustrated or discussed herein) probes 2220 can be disposed in a pattern in which probes 2220 can contact terminals 116 of DUT 114 (see FIG. 1) that are spaced as close together as two-hundred microns, one-hundred microns, ninety microns, eighty microns, fifty microns, or less, although the spacing between adjacent terminals 2220 in other embodiments can be greater than two-hundred microns.

Probe card assembly 2200 illustrated in FIG. 22 is an example only, and variations are of course possible. For example, probe card assembly 2200 need not include all of the components. For example, interposer 2208 need not be included, and electrical paths 2206 can be electrically connected directly to electrical paths 2218, or other means can be provided for electrically connecting electrical paths 2206 to electrical paths 2218. As another example, probe card assembly 2200 can include additional components such as one or more stiffeners (not shown), and/or probe card assembly 2200 can include more than one probe substrate 2216.

As mentioned above, another example of contactor 106 in FIG. 1 can be a test socket, and FIG. 23 illustrates an example of such a test socket 2300. Test socket 2300 of FIG. 23 can thus replace contactor 106 in FIG. 1, and dies 2316 (two are shown but there can be fewer or more) can be the equivalent of DUT 114. (Terminals 2322 can be the equivalent of DUT terminals 116 in FIG. 1.)

One or more dies 2316a and 2316b can be inserted into test socket 2300 for testing. Test socket 2300 can comprise a substrate 2310 (which can be an example of a support substrate) have receptacles 2318, which can receive dies 2316a, 2316b. Die 2316a is shown fully inserted into a receptacle 2318 and die 2316b is shown being inserted into a receptacle 2318. Contact elements 2314 extending from substrate 2310 can make electrical connections with terminals 2322 on the dies 2316. Contact elements 2314 can be electrically connected to one or more electrical connectors 2302 (e.g., by electrical paths 2304 on and/or in wiring substrate 2310), which can be connectable to channels 104 in FIG. 1. Contact elements 2314 can be an electrically conductive, non-linear (e.g., responds to force as illustrated in FIGS. 3A-4 and discussed above), vertical contact elements with bodies comprising leaves like contact elements 200, 500, 600, 700, 800, 900, 1000, 2000, 2100 and/or 2100' (including any variation thereof illustrated or discussed herein). Thus, any of contact elements 200, 500, 600, 700, 800, 900, 1000, 2000, 2100 and/or 2100' as well as contact elements 2500, 2600, and 2700 to be discussed below (including any variation thereof illustrated or discussed herein) can replace contact elements 2314 in test socket 2300.

As mentioned above, testing applications (e.g., test contactor 106 (including probe card assembly 2200 or test socket 2300) are not the only applications of electrically conductive, non-linear, vertical contact elements disclosed herein. As also mentioned, another example of an application is interconnecting two or more electronic devices. For example, the vertical contact elements disclosed herein can be used in other types of contactors. Thus, any of vertical contact elements 200, 500, 600, 700, 800, 900, 1000, 2000, 2100 and/or 2100' as well as contact elements 2500, 2600, and 2700 to be discussed below (including any variation thereof illustrated or discussed herein) can be part of other types of contactors.

Figure 24A:
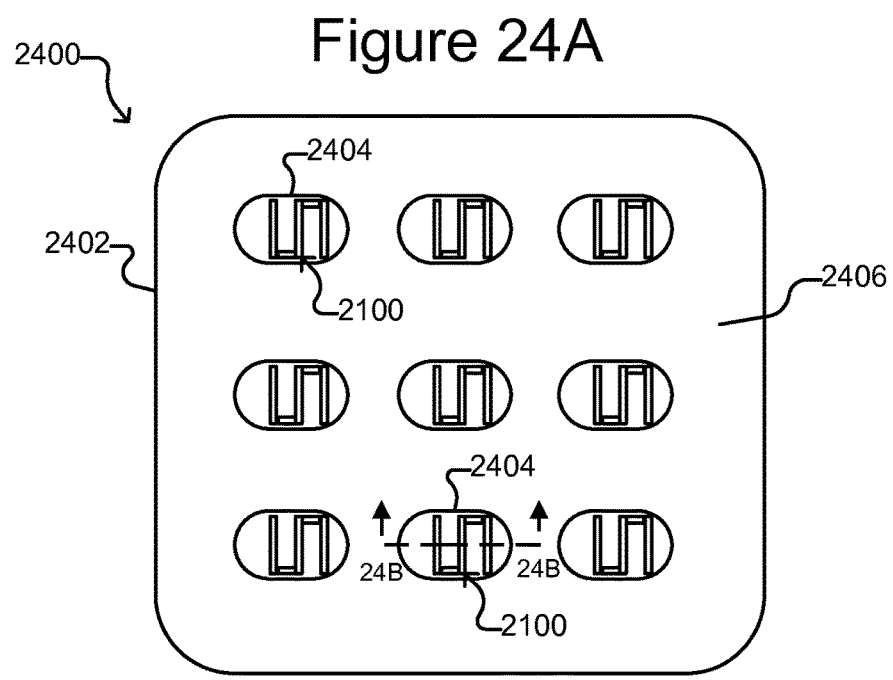
FIGS. 24A and 24B illustrate a contactor comprising vertical contact elements according to some embodiments of the invention.
Figure 24B:
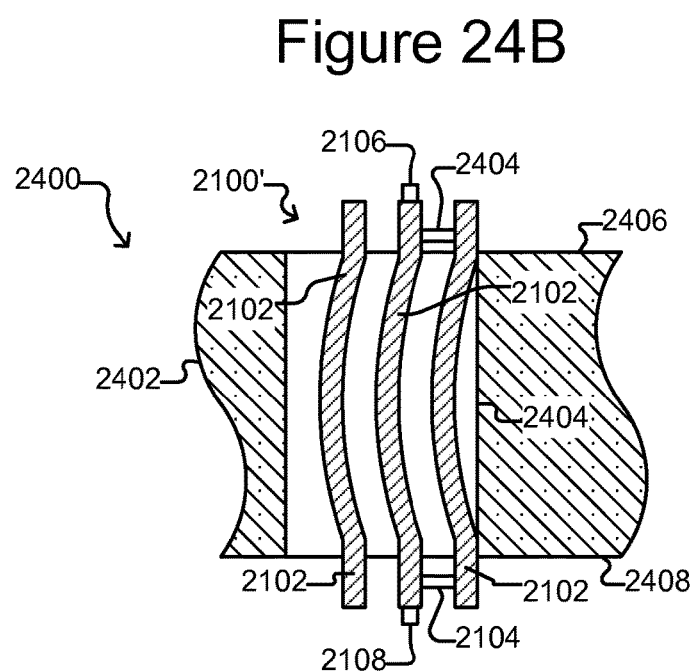

FIGS. 24A and 24B illustrate an example of a contactor 2400 in which contact elements 2100' can be disposed. As shown in FIGS. 24A and 24B, contact elements 2100' can be disposed in holes 2404 in a substrate 2402 (which can be an example of a support substrate) that comprises surfaces and 2408. Contact element 2100 can comprise an elastic material and can be sized such that each is compressed to fit in a hole 2404 and then, when released from compression, expand against the sidewalls of hole 2404 and are thus retained in the hole 2404. Although not shown, in some embodiments, an outside leaf 2102 and a side wall of hole 2404 can include mating features (not shown) that can position and/or retain contact element 2100' in hole 2404. Moreover, holes 2404 can be configured differently than shown in FIGS. 24A and 24B. For example, holes 2404 can be different shapes and need not be uniform passages through substrate 2402. In some embodiments, holes 2404 can be replaced with guides located near the surface 2406 and guides located near the surface 2408.

Contactor 2400 can be an example of interposer 2208 of probe card assembly 2200 in FIG. 22. Contactor 2400 can thus replace interposer 2208 in the probe card assembly of FIG. 22. Substrate 2402 can take the place of interposer substrate 2212. The portions of leaves 2102 that are outside of substrate 2402 and extend away from surface 2406 (including contact end 2106) can take the place of elements 2210, and the portions of leaves 2102 that are outside of substrate 2402 and extend from surface 2408 (including contact end 2108) can take the place of the elements 2214.

Contactor 2400 of FIG. 24 is an example only. Any of contact elements 200, 500, 600, 700, 800, 900, 1000, 2000, and/or 2100 as well as contact elements 2500, 2600, and 2700 to be discussed below (including any variation thereof illustrated or discussed herein) can used in place of contact elements 2100' and can thus replace contact elements 2100' in FIG. 24.

Figure 25:
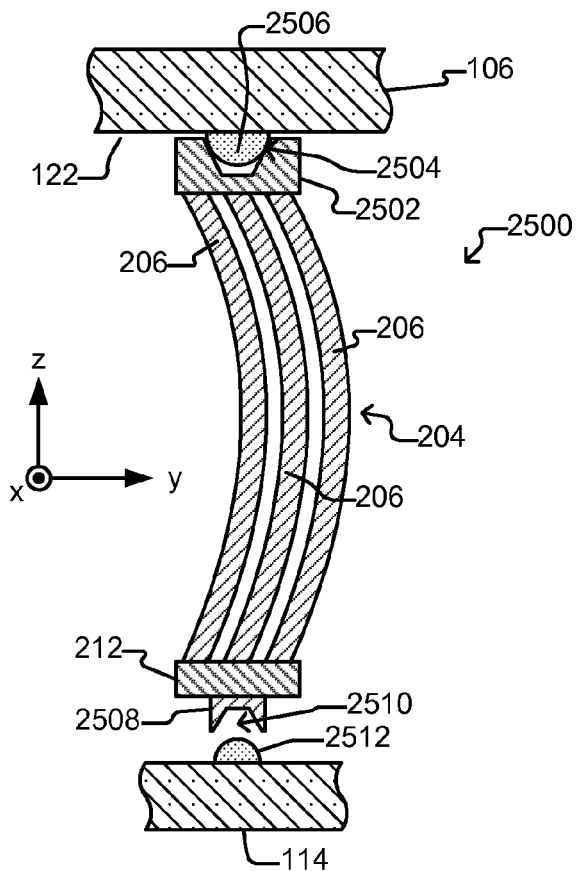
FIG. 25 illustrates examples of guiding the first base end and the second base end of the vertical contact element of FIGS. 2A and 2B according to some embodiments of the invention.

Referring again to contact element 200 illustrated in FIGS. 2A and 2B, provisions for guiding the location of the first base end 202 and the second base end 212 can be included in some embodiments of the invention. For example, the first base end 202 can be maintained generally stationary in the "x,y" plane by attaching the first base end 202 to contactor 106. For example, the first base end 202 can be attached to a surface 122 of contactor 106 or a component of contactor 106 by solder, brazing, adhesive, or the like. As another example, the second base end 202 can be free generally as shown in FIGS. 2A and 2B. FIGS. 25-27 illustrate.

FIG. 25 illustrates a vertical contact element 2500 having a body 204 comprising spaced apart leaves 206 and a second base end 212 that can be the same as like named and numbered elements of contact element 200. First base end 2502 in FIG. 25 can, however, replace first base end 202 in FIGS. 2A and 2B, and contact tip 2508 in FIG. 25 can replace contact tip 214 in FIGS. 2A and 2B. Contact element 2500, like contact element 200, can nevertheless be an electrically conductive, non-linear (e.g., responds to force as illustrated in FIGS. 3A-4 and discussed above), vertical contact element as discussed above (first base end 2502 and second base end 212 are on an axis like axis 216).

As shown, the first base end 2502 can include a guide feature 2504 that corresponds to a guide feature 2506 on the surface 122 of contactor 106. For example, either of the guide features 2506 or 2506 can be a male connector or a female connector. The guide features 2504 and 2506 can guide the first base end 2502 into and maintain the first base end 2502 in a desired position in an "x,y" plane. The first base end 2502 can be attached to the surface 122 of the contactor 106 such as by solder, brazing, adhesive, or the like. Alternatively, the first base end 2502 can be held in proximity to the surface 122 of the contactor 106 without being attached to the surface 122.

As also shown in FIG. 25, contact tip 2508 can include a guide feature 2510 (e.g., in the form of a cup shaped tip as shown) that corresponds to a terminal 2512 on DUT 114. For example, the terminals 2512 of DUT 114 can be bumps (e.g., solder bumps), and the guide feature 2510 can be configured to mate with a terminal 2512 and thereby guide the second base end 212 into and maintain the second base end 212 in a desired position in an "x,y" plane. For example, either of the guide feature 2510 or the terminal 2512 can be a male connector or a female connector.

Figure 26A:
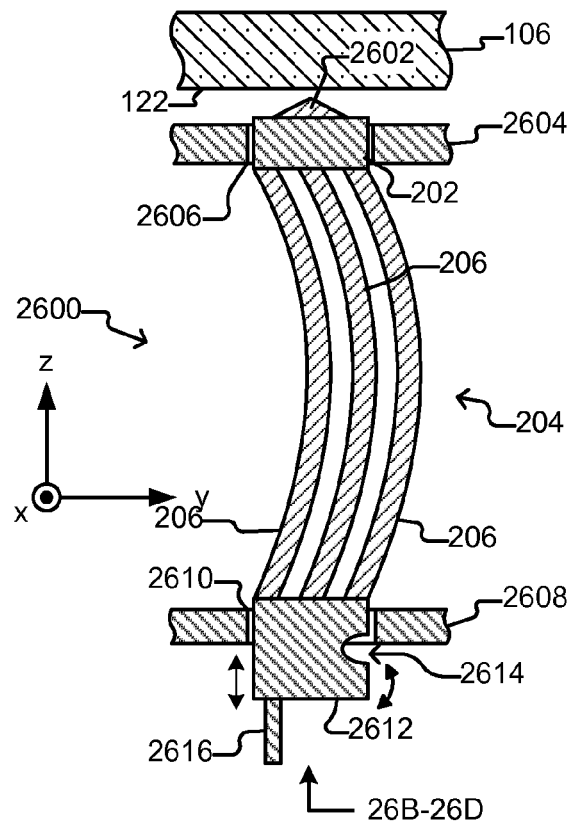
FIG. 26A illustrates a variation of the vertical contact element of FIGS. 2A and 2B in which the first base end and the second base end are disposed in guide structures according to some embodiments of the invention.
Figure 27:
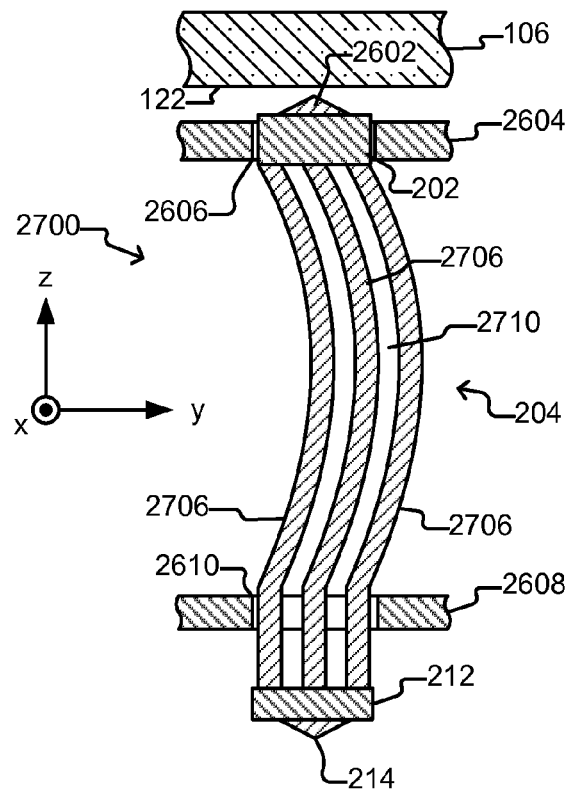
FIG. 27 illustrates another variation of the vertical contact element of FIGS. 2A and 2B in which the first base end and the second base end are disposed in guide structures according to some embodiments of the invention.

FIG. 26A illustrates a vertical contact element 2600 comprising a first base end 202 and body 204 comprising leaves 206 that can be the same as like named and numbered elements of contact element 200. Contact element 2600 can be an electrically conductive, non-linear (e.g., responds to force as illustrated in FIGS. 3A-4 and discussed above), vertical contact element as defined above (first base end 202 and second base end 2612 are on or aligned on axis 216).

As illustrated in FIG. 26A, however, first base end 202 is not coupled to contactor 106. For example, first base end 202 can include a contact tip 2602 (which can be similar or the same as contact tip 214) and can be held with contact tip 2602 in contact with or in proximity to surface 122 of contactor 106 (e.g., a terminal (not shown) of contactor 106) but without contact tip 2602 being coupled to contactor 106. In some embodiments, first base end 202 can be held by guide structure 2604, which can be coupled to contactor 106 such that contact tip 2602 is in contact with or proximity to surface 122 of contactor 106. For example, first base end 202 can be disposed in a hole 2606 in the guide structure 2604, which can maintain the first base end 202 in a desired position in an "x,y" plane. Guide structure 2604 can, for example, be a guide plate with multiple holes 2606 for holding multiple contact elements.

As shown in FIG. 26A, second base end 2612 can also be disposed in a hole 2610 in a guide structure 2608. Typically, as a contact tip 2616 of the second base end 2612 is pressed against a terminal 116 of a DUT (see FIG. 1), the second base end 2612 moves up and down in the hole 2610. As illustrated in FIG. 26A, however, a notch 2614 can be provided that facilitates movement of the second base end 2612 along the "z" axis with minimal rotation about the "x" axis. In other embodiments, more notches on the second base end 2612 and/or the first base end 202 can facilitate or prevent rotation. Regardless, guide structure 2608 can maintain the second base end 2612 in a desired position in an "x,y" plane. Guide structure 2608 can, for example, be a guide plate with multiple holes 2610 for holding multiple contact elements.

FIGS. 26B-26E (each of which shows a bottom view of the contact element 2600 of FIG. 26A) illustrate examples of a hole 2610 in guide structure 2608 according to some embodiments of the invention. As generally discussed above (and as noted by the arrows in FIGS. 26B-26E), the second base end 2612 can tend to move laterally (e.g., in the "x,y" plane) as the contact element 2600 compresses and then buckles. As illustrated in FIGS. 26B and 26C, the second base end 2612 and the hole 2610 can be shaped such that the second base end 2612 contacts a wall of the hole 2610, which thus impedes appreciable movement of the second base end 2612 and thus also prevents appreciable rotation about any axis of the second base end 2612 and contact tip 2616. The examples of a square or rectangular second base end 2612 and a square or rectangular hole 2610 in FIG. 26B are examples only, and those shapes can be any shapes that result in the foregoing contact of the second base end 2612 with a wall of the hole 2610. Similarly, the examples of a rectangular second base end 2612 and a circular hole 2610 are examples only, and those shapes can also be any shapes that result in the foregoing contact of the second base end 2612 with a wall of the hole 2610.

As illustrated in FIG. 26D, however, a protrusion or asymmetry 2620 in the second base end 2612 can cause the second base end 2612—and thus the contact tip 2616—to rotate (e.g., about the "z" axis) as the body 204 of the contact element 2600 (see FIG. 26A) compresses and then buckles. For example, as the second base end 2612 moves laterally as shown in FIG. 26D, the protrusion 2620 can contact a wall of the hole 2610 after which further lateral movement of the second base end 2612 can cause the second base end 2612—and thus the contact tip 2616—to rotate about the "z" axis as shown.

FIG. 26E illustrates another example in which the second base end 2612—and thus the contact tip 2616—can rotate as the body 204 of the contact element 2600 compresses and then buckles. As shown, the hole 2610 can have side walls that are angled differently than the sides of the second base end 2612. Thus, as illustrated in FIG. 26E, as the second base end 2612 moves laterally as shown and a corner of the second base end 2612 contacts a side wall of the hole 2610, the second base end 2612—and thus the contact tip 2616—can rotate (e.g., about the "z" axis).

Again, the particular shapes of the second base end 2612, protrusion 2620, and hole 2610 in FIGS. 26D and 26E are examples only, and other shapes can also cause the second base end 2612—and thus the contact tip 2616—to rotate. For example, the second base end 2612 in FIG. 26E can be a shape that is symmetrical and the hole 2610 can be a shape that is asymmetrical. The configurations shown in FIGS. 26D and 26E can be combined, for example, to create back and forth rotating motions or to achieve a greater rotation motion.

The illustrations shown in FIGS. 26B-26E are examples only. For example, the first base end 202 in FIG. 26A can be configured like any of the examples of the second base end 2612 in FIGS. 26B-26E, and the hole 2606 in the guide structure 2604 in FIG. 26A can similarly be configured like any of the examples of the hole 2610 in the second guide structure 2614 in FIGS. 26B-26E.

As discussed above, the holes 2610 illustrated in FIGS. 26D and 26E can cause the second base end 2612 and thus the contact tip 2616 to rotate. Yet another way to cause a contact element to rotate is to make the contact element with regions of different stiffness. For example, referring to the contact element 200 illustrated in FIG. 14, the stiffness of leaf portions 1110 can be different than the stiffness of leaf portions 1310, which can cause the body 204 to rotate as the leaves 206 are compressed and then buckle. As another example, the stiffness of the body 204 of contact element 200 in FIGS. 2A and 2B can be different on one side of the axis 216 than on the opposite side of the axis 216. For example, different stiffness on one side versus the other side of the axis 216 could be achieved by materials with different modulus or by different number of leaves or varying thickness of the leaves on one side versus the other of the axis 216.

Yet another way to cause rotation or limit rotation is to make the body 204 of a contact element with different stiffness along the "y" axis. For example, referring to the contact element 800 illustrated in FIG. 8, the stiffness of each leaf 810 can be different. For example, the leaf 806 on the far left in FIG. 8 can have a stiffness and each of the remaining leaves 806 can have a greater stiffness than the leaf 806 to its immediate right. This imbalance can cause the contact element 800 to buckle in a preferred direction. The foregoing pattern of varying stiffness of leaves 810 or other patterns of varying stiffness of leaves 810 can also limit or impart rotation to the first base end 202 and/or the second base end 212. Such configurations or patterns of varying stiffness of leaves can be implemented in any of the contact elements illustrated and discussed herein.

Figure 30:
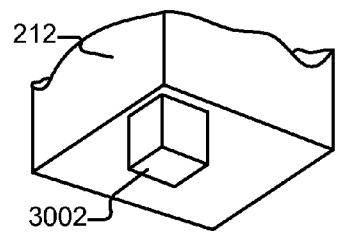
Figure 31A:
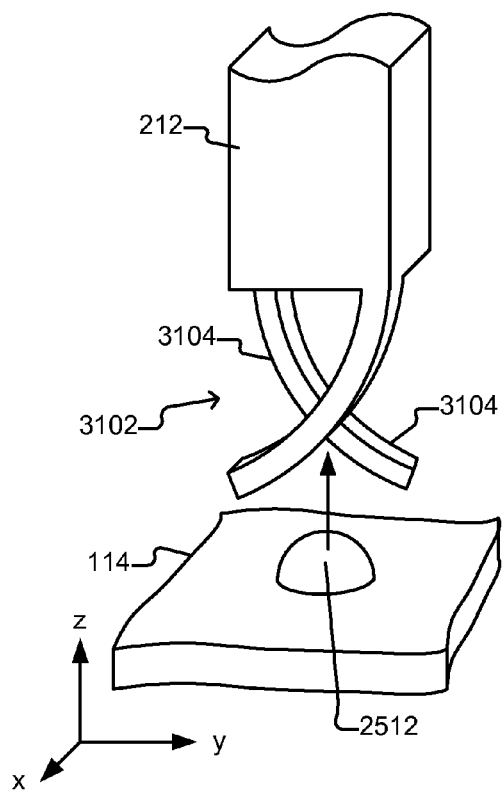
FIGS. 31A and 31B illustrate another example of a contact tip in the form of a split tip according to some embodiments of the invention.
Figure 31B:
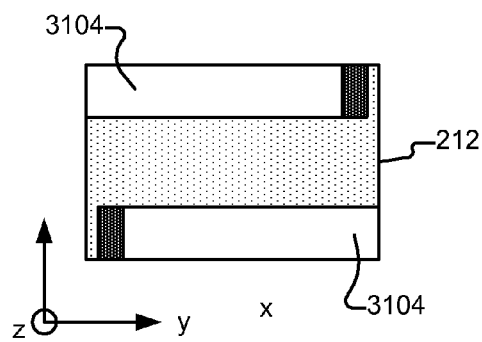

Still another way to cause rotation of a contact tip is to orient the contact tip in an offset manner, for example, as illustrated in FIG. 30 and as will be discussed below with respect to FIG. 30. A split contact tip such as illustrated in FIGS. 31A and 31B (which are discussed below) is yet another way to cause rotation of a contact tip.

It is noted that, although not shown in FIG. 26A, contact element 2600 need not include either guide structure 2604 or guide structure 2608, or contact element 2600 can include only one of the guide structures 2604 or 2608. For example, contact element 2600 can include guide structure 2608 but not guide structure 2604, in which case, contact tip 2602 or base end 202 (if contact element 2600 does not include contact tip 2602) can be coupled (e.g., soldered, form fit, or the like) to substrate 106. As another example contact element 2600 can include guide structure 2604 but not guide structure 2608.

FIG. 27 illustrates a variation of the contact element 2600 shown in FIG. 27. As shown in FIG. 27, ends of leaves 2706 can extend through the hole 2610 in guide structure 2608, and the second base end 212 can be disposed at the end of the leaves 2706 sufficiently below the guide structure 2608 to allow the ends of the leaves 2706 to move up and down in hole 2610 as leaves 2608 compress and then buckle. Although not shown, ends of leaves 2706 can extend through hole 2606, and the first base end 202 can be disposed at the end of the leaves 2706 sufficiently above the guide structure 2604 to allow the ends of the leaves 2706 to move up and down in the hole 2606 as leaves 2706 compress and then buckle.

Although not shown in FIG. 27, contact element 2700 need not include either guide structure 2604 or guide structure 2608, or contact element 2700 can include only one of the guide structures 2604 or 2608. For example, contact element 2700 can include guide structure 2608 but not guide structure 2604, in which case, contact tip 2602 or base end 202 (if contact element 2700 does not include contact tip 2602) can be coupled (e.g., soldered, form fit, or the like) to substrate 106. As another example contact element 2700 can include guide structure 2604 but not guide structure 2608.

The examples of contact elements 2500, 2600, and 2700 in FIGS. 25, 26, and 27 can be combined. For example the first contact end 2502 of FIG. 25 can be used in FIGS. 26 and 27 in place of the first contact end 202 and guide structure 2604. Similarly, the first contact end 202 and guide structure 2604 of FIGS. 26 and 27 can replace the first contact end 2502 in FIG. 25. As yet another example, the second base end 212 and contact tip 2508 in FIG. 25 can replace the second connect end 2612 and guide structure 2608 in FIG. 26A or the second contact end 212 and guide structure 2608 in FIG. 27. Similarly, the second contact end 2612 and guide structure 2608 of FIG. 26A or the second contact end 212 and guide structure 2608 of FIG. 27 can replace the second base end 212 and contact tip 2508 in FIG. 25. As another example, the hole 2606 in the guide structure 2604 and/or the hole 2610 in the guide structure 2608 can be configured like any of the examples illustrated in FIGS. 26B-26E of the hole 2610. Likewise, the first base end 202 and/or the ends of the leaves 2706 can be shaped like any of the examples illustrated in FIGS. 26B-26E of the second base end 2612.

Contact elements 2500, 2600, and/or 2700 (including any variations thereof discussed above) can replace contact elements 112, contact element 200, interconnection elements 2210, interconnection elements 2214, probes 2220, and/or contact elements 2314 in any figure or discussion above. Moreover, first base end 2502 can replacement first base end 202 in any figure or discussion above, and contact tip 2508 can similarly replace contact tip 214 in any figure or discussion above. Likewise, first base end 202 can be configured with contact tip 2602 and configured with guide structure 2604 as shown in FIG. 26A in any figure or discussion above, and second base end 212 in any figure or discussion above can likewise be replaced with the second base end 2612 and guide structure 2608 of FIG. 26A or the second base end 212 and guide structure 2608 of FIG. 27.

Figure 28:
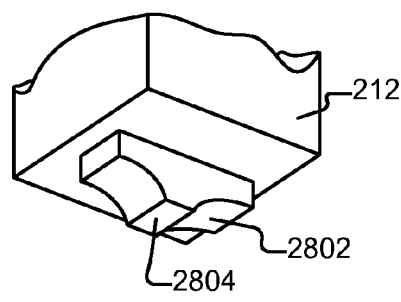
FIGS. 28-30 illustrate examples of contact tips according to some embodiments of the invention.
Figure 29:
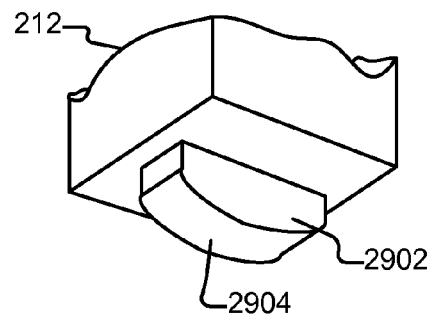

FIGS. 28-31B illustrate examples of shapes of contact tips 2802, 2902, 3002, and 3102 that can replace any of the contact tips 214, 2006, 2602, or 2616. For example, FIG. 28 illustrates a contact tip 2802 with a square or rectangular contact end 2804. In some embodiments, the sides of the contact end 2804 can be between four and twenty-five microns in length, although in other embodiments, the sides can be longer or shorter. As another example, FIG. 29 illustrates a contact tip 2902 in the form of a blade. As shown, the blade shape can be curved. Alternatively, the blade shape can be straight and thus have a straight rather than curved end 2904. Other examples of shapes of contact tips include a cupped shaped contact tip similar to the contact tip 2508 in FIG. 25.

FIGS. 31A (which shows a perspective view) and 31B (which shows a bottom view) illustrate yet another example of a contact tip 3102. As shown, contact tip 3102 can be a split contact tip comprising crossing arms 3104 that extend from the second base end 212. As shown, the arms 3104 (two are shown but there can be more) can extend from an end of the second base end 212, and the arms 3104 can cross forming a guide feature that can function generally like the guide feature 2510 of FIG. 25. For example, the crossing of arms 3104 can form a guide feature that receives a terminal 2512 on DUT 114 (see the discussion above of FIG. 25) and thereby guides the second base end 212 into and maintains the second base end 212 in a desired position in an "x,y" plane. The arms 3104 can also cause the second body end 212 to rotate about the "z" axis. The rotation can be caused by interaction of the arms 3104 with the ball-shaped terminal 2512. Although not shown in FIG. 25, a split contact tip like contact tip 3102 can replace base end 2502 in FIG. 25. Although not shown in FIG. 31A, terminal 2512 can alternatively be a flat pad structure, and interaction of the arms 3104 with such a terminal can cause the arms to scrub laterally across the terminal.

Any of contact tips 214, 2006, 2602, 2616, 2802, 2902, and/or 3102 can be offset from the center of the second base end 212 as contact tip 3002 is offset from the center of the second base end 212 in FIG. 30. Contact tips 2802 and/or 2902 can likewise be offset from the center of the second base end 212. Indeed, offsetting the contact tip can cause the contact element to rotate as the leaves of the contact element compress and then buckle.

Figure 32:
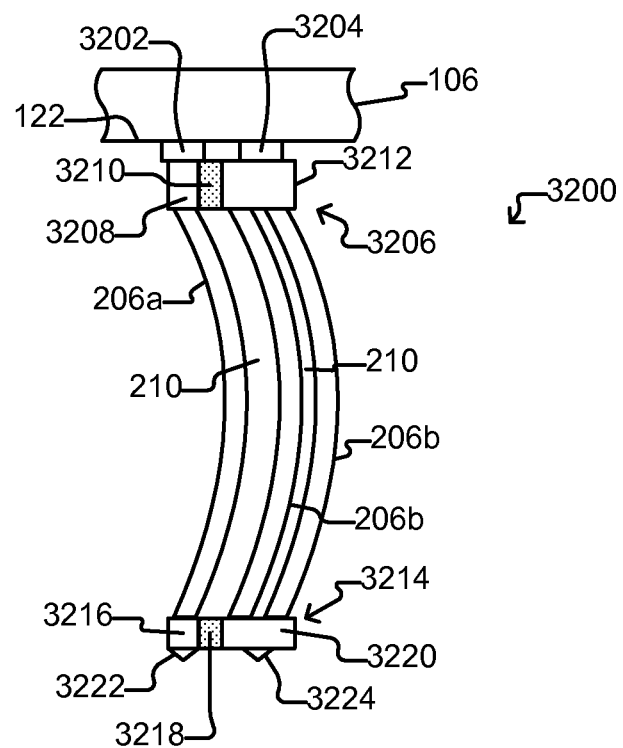
FIG. 32 illustrates an example of a contact element with multiple electrically insulated electrical paths according to some embodiments of the invention.

FIG. 32 illustrates yet another variation of a contact element with multiple leaves. The contact element 3200 in FIG. 32 can be an example of a Kelvin contact element. As will be seen, the contact element 3200 can provide a sense path and a force path for making certain electrical measurements such as measuring an electrical resistance of a terminal 116 of a DUT.

As shown, contact element 3200 can comprise a first base end 3206, which itself can comprise an electrically conductive sense portion 3208, an electrically conductive force portion 3212, and an electrically insulating portion 3210 there between. A second base end 3214 can similarly comprise an electrically conductive sense portion 3216, an electrically conductive force portion 3220, and an electrically insulating portion 3218 there between. One or more leaves 206a (one is shown but there can be more) can be attached at opposite ends to the sense portion 3208 and the sense portion 3216 as shown. Similarly, one or more leaves 206b (two are shown but there can be fewer or more) can be attached at opposite ends to the force portion 3212 and the force portion 3220 as shown. The contact element 3200 can thus provide a current sense path comprising sense portion 3210, leaf 206*a*, and sense portion 3216 between a sense terminal 3202 on contactor 106 and a sense contact tip 3222, and the contact element 3200 can also provide a current force path comprising force portion 3212, leaves 206*b*, and force portion 3220 between a force terminal 3204 on contactor 106 and a force contact tip 3224. Using known principles, contact element 3200 with current sense and current force paths can be used to perform four-wire Kelvin measurements.

Although specific embodiments and applications of the invention have been described in this specification, these embodiments and applications are exemplary only, and many variations are possible.

The invention claimed is:

1. An electrically conductive contact element, comprising:
   an electrically conductive first base attached to and extending from a surface of a support substrate;
   an electrically conductive second base spaced apart from said first base;
   a first leaf comprising a first end and a second end disposed on a first axis; and
   a second leaf comprising a first end and a second end disposed on a second axis, wherein the second axis is distinct from and parallel to the first axis,
   wherein no structural element is disposed in space from said first base to said second base between said first leaf and said second leaf,
   said contact element is configured to respond to application of a force parallel to said first axis and to said second axis by deforming such that said first base and said second base move toward each other,
   said first leaf and said second leaf are sufficiently elongated to respond to said force by compressing axially while said force is less than a buckling force and bending while said force is greater than said buckling force,
   said first end of said first leaf and said first end of said second leaf are attached directly to said first base in a presence and an absence of said force, and
   said second end of said first leaf and said second end of said second leaf are attached directly to said second base in a presence and an absence of said force.

2. The contact element of claim 1, wherein said leaves of said contact element each has a same curvature.

3. The contact element of claim 1, wherein said leaves of said contact element each has a different curvature one from another.

4. The contact element of claim 1, wherein a stiffness of each of said leaves varies along its length.

5. The contact element of claim 1, wherein said contact element further comprises tie bars between adjacent ones of said leaves of said contact element.

6. The contact element of claim 1, wherein:
   a body of said first leaf between said first end and said second end of said first leaf is offset from said first axis, and
   a body of said second leaf between said first end and said second end of said second leaf is offset from said second axis.

7. The contact element of claim 6, wherein said body of said first leaf and said body of said second leaf are offset in a same direction.

8. The contact element of claim 1, wherein:
   said first leaf and said second leaf are disposed in a stack, and
   said contact element further comprises tie bars connecting said first leaf and said second leaf.

9. The contact element of claim 1, wherein said first base and said second base are disposed on a third axis that is substantially parallel with said force.

10. The contact element of claim 1, wherein said first leaf and said second leaf are configured to generate a substantially zero net force perpendicular to said force as said first leaf and said second leaf compress axially in response to said force.

11. The contact element of claim 1, wherein said contact element comprises a first material and a second material that is different than said first material, said second material having a greater electrical conductivity than said first material.

12. The contact element of claim 1 further comprising means for rotating said second base as said first leaf and said second leaf compress axially in response to said force.

13. The contact element of claim 12, wherein said rotating is about an axis that is substantially parallel to a direction in which said first leaf and said second leaf compress in response to said force.

14. The contact element of claim 1 further comprising a contact tip coupled to said second base.

15. The contact element of claim 14, wherein said contact tip comprises one of a blade or a cup shape.

16. The contact element of claim 14, wherein said contact tip comprises crossing arms extending from said second base.

17. The contact element of claim 14, wherein said contact tip comprises a contact end with sides that are between four and twenty-five microns.

18. A contactor comprising:
    said support substrate, and
    a plurality of said contact elements of claim 1, wherein said first base of each of said contact elements is attached to and extends from said surface of said support substrate, each said contact element comprising a contact tip at said second base of said contact element, wherein said contact tips of said contact elements are substantially disposed in a plane.

19. The contactor of claim 18, wherein said first base and said second base of each of said contact elements are disposed on an axis that is substantially perpendicular to said plane.

20. The contactor of claim 18, wherein adjacent ones of said contact tips are disposed less than or equal to ninety microns from each other.

21. The contactor of claim 18, wherein said contact tips are configured to contact terminals of a device under test (DDT), said contactor further comprising:
    an interface to a test controller for controlling testing of said DDT; and
    electrical interconnections from said interface to said contact elements.

22. The contactor of claim 21, wherein said contactor is a probe card assembly and further comprises a wiring substrate coupled to said support substrate and comprising said interface, wherein said electrical interconnections comprise electrical from said interface through said wiring substrate and electrical connections through said support substrate to said interconnection elements.

23. The contactor of claim 21, wherein:
said contactor is a test socket and said DDT comprises singulated semiconductor dies,
said contactor further comprising receptacles for receiving said dies, and
said interconnections comprise electrical connections on and/or in said support substrate from said interface to said interconnection elements.

24. The contact element of claim 1, wherein said force is from contact of a terminal of a device under test with said contact element.

25. The contact element of claim 1, wherein:
in an absence of said force, said second base is free standing, and
in a presence of said force, said second base is without lateral constraint.

26. The contact element of claim 1 further comprising one and only one contact tip coupled to said second base.

27. The contact element of claim 1, wherein said first base and said second base electrically connect said first leaf to said second leaf.

28. An electrically conductive contact element, comprising:
an electrically conductive first base attached to and extending away from a surface of a support substrate;
an electrically conductive second base spaced apart from the first base;
a first leaf comprising first and second ends disposed on a first axis; and
a second leaf comprising first and second ends disposed on a second axis, wherein the second axis is distinct from and parallel to the first axis;
wherein no structural element is disposed in space from the first base to the second base between the first leaf and the second leaf,
said contact element is configured to respond to application of a force parallel to said first axis and to said second axis by deforming such that said first base and said second base move toward each other,
the first and second leafs are configured so that they respond to a force through the contact element substantially parallel with the first axis and the second axis by compressing axially when the force is less than a buckling force and bending when the force is greater than the buckling force,
the first end of the first and second leafs are attached directly to the first base in a presence and an absence of the force,
the second end of the first and second leafs are attached directly to the second base in a presence and an absence of the force, and
wherein the first axis is substantially perpendicular to a surface of the second base to which the first leaf is attached and the second axis is substantially perpendicular to a surface of the second base to which the second leaf is attached.

* * * * *